United States Patent
D'Evelyn et al.

(10) Patent No.: US 12,252,812 B2
(45) Date of Patent: *Mar. 18, 2025

(54) ULTRAPURE MINERALIZER AND IMPROVED METHODS FOR NITRIDE CRYSTAL GROWTH

(71) Applicant: SLT Technologies, Inc., Los Angeles, CA (US)

(72) Inventors: Mark P. D'Evelyn, Vancouver, WA (US); Paul M. Von Dollen, Brush Prairie, WA (US); Lisa M. Gay, Vancouver, WA (US); Douglas W. Pocius, Aguanga, CA (US); Jonathan D. Cook, Santa Barbara, CA (US)

(73) Assignee: SLT Technologies, Inc., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/434,568

(22) Filed: Feb. 6, 2024

(65) Prior Publication Data

US 2024/0240352 A1    Jul. 18, 2024

Related U.S. Application Data

(63) Continuation of application No. 17/514,656, filed on Oct. 29, 2021, now Pat. No. 12,024,795.
(Continued)

(51) Int. Cl.
 C30B 7/10     (2006.01)
 C30B 29/40    (2006.01)
(52) U.S. Cl.
 CPC .......... C30B 7/105 (2013.01); C30B 29/403 (2013.01)

(58) Field of Classification Search
 CPC .......... C30B 7/10; C30B 7/105; C30B 29/38; C30B 29/403
 See application file for complete search history.

(56) References Cited

U.S. PATENT DOCUMENTS 6,129,900 A    10/2000  Satoh et al.
6,273,948 B1   8/2001   Porowski et al.
(Continued)

FOREIGN PATENT DOCUMENTS

CN    101061570 A    10/2007
JP    H0658794 A     3/1994
(Continued)

OTHER PUBLICATIONS

Japanese Application No. 2021-176055, Office Action dated Jan. 25, 2023, 9 pages.
(Continued)

*Primary Examiner* — Robert M Kunemund
(74) *Attorney, Agent, or Firm* — Patterson + Sheridan, LLP

(57) ABSTRACT

A method for growth of group III metal nitride crystals includes providing one or more transfer vessels, a source vessel containing a condensable mineralizer composition, and a receiving vessel, chilling a metallic surface within the one or more transfer vessels, transferring a quantity of the condensable mineralizer composition to the one or more transfer vessels via a vapor phase and causing condensation of the condensable mineralizer composition within the one or more transfer vessels, measuring the quantity of the condensable mineralizer composition within the at least one transfer vessel, transferring at least a portion of the condensable mineralizer composition to the receiving vessel, and forming at least a portion of a group III metal nitride boule by an ammonothermal crystal growth process.

19 Claims, 10 Drawing Sheets

Related U.S. Application Data

(60) Provisional application No. 63/108,830, filed on Nov. 2, 2020.

(56) References Cited

U.S. PATENT DOCUMENTS

| | | |
|---|---|---|
| 6,398,867 B1 | 6/2002 | D'Evelyn et al. |
| 6,406,540 B1 | 6/2002 | Harris et al. |
| 6,528,427 B2 | 3/2003 | Chebi et al. |
| 6,596,079 B1 | 7/2003 | Vaudo et al. |
| 6,656,615 B2 | 12/2003 | Dwilinski et al. |
| 6,765,240 B2 | 7/2004 | Tischler et al. |
| 6,861,130 B2 | 3/2005 | D'Evelyn et al. |
| 6,887,144 B2 | 5/2005 | D'Evelyn et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,125,453 B2 | 10/2006 | D'Evelyn et al. |
| 7,170,095 B2 | 1/2007 | Vaudo et al. |
| 7,175,704 B2 | 2/2007 | D'Evelyn et al. |
| 7,252,712 B2 | 8/2007 | Dwilinski et al. |
| 7,316,746 B2 | 1/2008 | D'Evelyn et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwili ski et al. |
| 7,569,206 B2 | 8/2009 | Spencer et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,303,710 B2 | 11/2012 | D'Evelyn |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 9,299,555 B1 | 3/2016 | Alexander et al. |
| 10,029,955 B1 | 7/2018 | Rajeev et al. |
| 12,024,795 B2 * | 7/2024 | D'Evelyn ............... C30B 7/105 |
| 2002/0189532 A1 | 12/2002 | Motoki et al. |
| 2003/0127041 A1 | 7/2003 | Xu et al. |
| 2003/0140845 A1 | 7/2003 | D'Evelyn et al. |
| 2003/0183155 A1 | 10/2003 | D'Evelyn et al. |
| 2003/0209191 A1 | 11/2003 | Purdy |
| 2004/0000266 A1 | 1/2004 | D'Evelyn et al. |
| 2005/0087753 A1 | 4/2005 | D'Evelyn et al. |
| 2005/0098095 A1 | 5/2005 | D'Evelyn et al. |
| 2005/0205215 A1 | 9/2005 | Giddings et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0048699 A1 | 3/2006 | D'Evelyn et al. |
| 2006/0096521 A1 | 5/2006 | D'Evelyn et al. |
| 2006/0177362 A1 | 8/2006 | D'Evelyn et al. |
| 2006/0207497 A1 | 9/2006 | D'Evelyn et al. |
| 2007/0105351 A1 | 5/2007 | Motoki et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0156254 A1 | 7/2008 | Dwilinski et al. |
| 2008/0193363 A1 | 8/2008 | Tsuji |
| 2009/0092536 A1 | 4/2009 | Kawabata et al. |
| 2009/0140287 A1 | 6/2009 | Fujiwara et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0320745 A1 | 12/2009 | D'Evelyn et al. |
| 2010/0003492 A1 | 1/2010 | D'Evelyn |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0075175 A1 | 3/2010 | Poblenz et al. |
| 2010/0104495 A1 | 4/2010 | Kawabata et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2011/0100291 A1 | 5/2011 | D'Evelyn |
| 2011/0183498 A1 | 7/2011 | D'Evelyn |
| 2011/0220912 A1 | 9/2011 | D'Evelyn |
| 2011/0256693 A1 | 10/2011 | D'Evelyn et al. |
| 2011/0268645 A1 | 11/2011 | Mikawa et al. |
| 2012/0000415 A1 | 1/2012 | D'Evelyn et al. |
| 2012/0118223 A1 | 5/2012 | D'Evelyn |
| 2012/0137966 A1 | 6/2012 | D'Evelyn et al. |
| 2013/0119401 A1 | 5/2013 | D'Evelyn et al. |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |
| 2014/0147650 A1 | 5/2014 | Jiang et al. |

FOREIGN PATENT DOCUMENTS

| | | |
|---|---|---|
| JP | 2004360741 A | 12/2004 |
| JP | 2005-289797 A | 10/2005 |
| JP | 2017160071 A | 9/2017 |
| JP | 6756495 B2 | 9/2020 |
| WO | 2006/057463 A1 | 6/2006 |
| WO | 2007004495 A1 | 1/2007 |
| WO | 2010/068916 A1 | 6/2010 |
| WO | 2011/044554 A1 | 4/2011 |

OTHER PUBLICATIONS

Dwilinski, et al, Journal of Crystal Growth 310, 3911 (2008).
Ehrentraut, et al., Journal of Crystal Growth 305, 204 (2007).
Wang, et al., Crystal Growth & Design 6, 1227 (2006).
Stepin, et al. Poluch. Anal. Vestchestv. Osoboi Chist., 5th, 91-94 (1978).
Naumova, et al. Zh. Prikh. Khim. 52, 249 (1979).
D'Evelyn et al. U.S. Appl. No. 13/472,356, filed May 15, 2012.
Callahan et al., 'Synthesis and Growth of Gallium Nitride by the Chemical Vapor Reaction Process (CVRP)', MRS Internet Journal Nitride Semiconductor Research', vol. 4, No. 10, 1999, p. 1-6.
D'Evelyn et al., 'Bulk GaN Crystal Growth by the High-Pressure Ammonothermal Method', Journal of Crystal Growth, vol. 300, 2007, p. 11-16.
Ehrentraut et al., 'The ammonothermal crystal growth of gallium nitride-A technique on the up rise', Proceedings IEEE, 2010, 98(7), p. 1316-1323.
Fang., 'Deep centers in semi-insulating Fe-doped native GaN substrates grown by hydride vapour phase epitaxy', Physica Status Solidi, vol. 5, No. 6, 2008, p. 1508-1511.
Fujito et al., 'Development of Bulk GaN Crystals and Nonpolar/Semipolar Substrates by HVPE', MRS Bulletin, May 2009, vol. 34, No. 5, p. 313-317.
Fukuda et al., 'Prospects for the Ammonothermal Growth of Large GaN Crystal', Journal of Crystal Growth, vol. 305, 2007, p. 304-310.
Gladkov et al., 'Effect of Fe doping on optical properties of freestanding semi-insulating HVPE GaN: Fe', Journal of Crystal Growth, 312, 2010, p. 1205-1209.

(56) References Cited

OTHER PUBLICATIONS

Grzegory, 'High pressure growth of bulk GaN from Solutions in gallium', Journal of Physics Condensed Matter, vol. 13, 2001, p. 6875-6892.

Lide et al., 'Thermal Conductivity of Ceramics and Other Insulating Materials', CRC Handbook of Chemistry and Physics, 91st Edition, 2010-2011, p. 12-203 and 12-204.

Lu et al., 'Structure of the Cl-passivated GaAs(111) surface', Physical Review B, Nov. 15, 1998, vol. 58, No. 20, p. 13820-13823.

Massies et al., 'Surfactant mediated epitaxial growth of InxGa1-xAs on GaAs (001)', Applied Physics Letters, vol. 61, No. 1, Jul. 6, 1992, p. 99-101.

Moutanabbir, 'Bulk GaN Ion Cleaving', Journal of Electronic Materials, vol. 39, 2010, p. 482-488.

Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, p. 103509-1-103509-4.

Pattison et al., 'Gallium Nitride Based Microcavity Light Emitting Diodes With 2λ Effective Cavity Thickness', Applied Physics Letters, vol. 90, Issue 3, 031111, 2007, 3 pages.

Porowski, 'High Resistivity GaN Single Crystalline Substrates', Acta Physica Polonica A, vol. 92, No. 2, 1997, p. 958-962.

Porowski, 'Near Defect Free GaN Substrates', Journal of Nitride Semiconductor, 1999, p. 1-11.

Sarva et al., 'Dynamic Compressive Strength of Silicon Carbide Under Uniaxial Compression', Material Sciences and Engineering, vol. A317, 2001, p. 140-144.

Sharma et al., 'Vertically Oriented GaN-based air-gap distributed Bragg reflector structure fabricated using band-gapselective photoelectrochemical etching', Applied Physics Letters, vol. 87, 2005, p. 051107.

Sumiya et al., 'High-pressure synthesis of high-purity diamond crystal', Diamond and Related Materials, 1996, vol. 5, p. 1359-1365.

Tyagi et al., 'Partial Strain relaxation via misfit dislocation generation at heterointerfaces in (Al,In)GaN epitaxial layers grown on semipolar (1122) GaN free standing substrates', Applied Physics Letters 95, 2009, p. 251905.

Wang et al, 'Ammonothermal Growth of GaN Crystals in Alkaline Solutions', Journal of Crystal Growth, vol. 287, 2006, p. 376-380.

Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, 2004, p. 1-19.

\* cited by examiner

ULTRAPURE MINERALIZER AND IMPROVED METHODS FOR NITRIDE CRYSTAL GROWTH

CROSS-REFERENCE TO RELATED APPLICATIONS

This application is a continuation of U.S. patent application Ser. No. 17/514,656, filed Oct. 29, 2021 now U.S. Pat. No. 12,024,795, which claims priority to U.S. Provisional Patent Application Ser. No. 63/108,830, filed on Nov. 2, 2020, which herein is incorporated by reference.

BACKGROUND

Field

The present disclosure generally relates to processing of materials for growth of crystals useful for forming bulk or patterned substrates that can be used to form a variety of optoelectronic, integrated circuit, power device, laser, light emitting diode, photovoltaic, and other related devices.

Description of Related Art

Gallium nitride containing crystalline materials serve as substrates for manufacture of conventional optoelectronic devices, such as blue light emitting diodes and lasers. Such optoelectronic devices have been commonly manufactured on sapphire or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates achieved make it difficult to provide a bulk layer of GaN material. Additionally, dislocation densities are also high and lead to poorer optoelectronic device performance.

Growth of nitride crystals by ammonothermal synthesis has been proposed. Ammonothermal crystal growth methods are expected to be scalable, as described by Dwilinski, et al, *J. Crystal Growth* 310, 3911 (2008), by Ehrentraut, et al., *J. Crystal Growth* 305, 204 (2007)], by D'Evelyn, et al. *J. Crystal Growth* 300, 11 (2007), and by Wang, et al., *Crystal Growth & Design* 6, 1227 (2006). The ammonothermal method generally requires a mineralizer, which chemically reacts with a polycrystalline source material to form a soluble intermediate that is transported in a supercritical fluid and is then recrystallized onto seed crystals. An ongoing challenge of ammonothermally-grown GaN crystals is a significant level of impurities, which cause the crystals to be colored, e.g., yellowish, greenish, grayish, or brownish. The residual impurities may cause optical absorption in light emitting diodes fabricated on such substrates, negatively impacting efficiency, and may also degrade the electrical conductivity and/or generate stresses within the crystals. One potential source of the impurities is the mineralizer.

A number of mineralizers have been proposed for ammonothermal growth of crystalline group III metal nitrides. These include alkali metals; alkali imide, imido-amide, amide, nitride, hydride, or azide; an alkaline earth metal, imide, imido-amide, amide, nitride, hydride, or azide; ammonium halide, a group III metal halide, or a reaction product between a group III metal, ammonia, and hydrogen halide. Most of these mineralizers are highly hygroscopic and/or moisture sensitive, with the consequence that it is rather difficult to achieve low levels of oxygen impurity. For ammonobasic mineralizer chemistry, Dwilinski, et al. (U.S. Pat. No. 7,364,619) proposed the use of azides, which are commercially available and are less hygroscopic and therefore easier to purify than the corresponding amides or nitrides. However, azides have the disadvantage of being chemically unstable and may decompose to form excess nitrogen gas under typical ammonothermal conditions. For ammonoacidic chemistry, ammonium chloride and ammonium fluoride are commercially available, with purity specifications above 99.99% on a trace metals basis (that is, the impurity levels of oxygen and moisture are not specified). Ammonoacidic mineralizers, including mineralizers containing fluoride, may offer certain advantages over ammonobasic mineralizers. Stepin, et al. (*Poluch. Anal. Vestchestv. Osoboi Chist.*, $5^{th}$, 91-94 (1978)) suggested forming $NH_4Cl$ from HCl and $NH_3$, and Naumova, et al. (*Zh. Prikh. Khim.* 52, 249 (1979)) suggested purifying $NH_4Cl$ by sublimation. However, to the best of our knowledge, none of these authors specified the oxygen impurity levels that were achievable by these methods.

Mikawa et al. (U.S. Application Publication No. 2011/0268645) disclosed formation of ultrapure ammonium halides by reaction of ultrapure hydrogen halide with ultrapure ammonia and their use as a mineralizer for ammonothermal gallium nitride crystal growth. However, the methods disclosed by Mikawa et al. are not well suited for working with a condensable hydrogen halide such as HF, useful for synthesizing fluoride-containing mineralizers.

Alexander, et al. (U.S. Pat. No. 9,299,555) disclosed formation of ultrapure ammonium fluoride by means of vapor phase transfer and an intermediate condensation process. However, the methods of Alexander et al. have certain limitations and the current disclosure presents several improvements.

Therefore, what is needed is a method for low-cost manufacturing of fluoride-containing mineralizers that are suitable for large scale manufacturing of bulk gallium nitride crystals and do not contribute to impurities in the bulk crystals.

SUMMARY

According to the present disclosure, techniques related to processing of materials for growth of crystals are provided. More particularly, the present disclosure provides a mineralizer suitable for use as a raw material for crystal growth of a group III metal nitride crystal by an ammonobasic or ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In a specific embodiment, the present disclosure provides a mineralizer composition. The mineralizer includes one or more compositions comprising fluorine, including hydrogen fluoride (HF), ammonium fluoride ($NH_4F$), ammonium acid fluoride ($NH_5F_2$), gallium fluoride ($GaF_3$) and its diamine complex ($GaF_3 \cdot 2\ NH_3$), and hexafluoroammonium gallate (($NH_4$)$_3GaF_6$). In certain embodiments, the mineralizer comprises a composition comprising two or more of fluorine (F), hydrogen (H), nitrogen (N), and gallium (Ga), or a reaction product between a metal, ammonia, and a hydrogen fluoride or a reaction product between two or more of the compositions. The mineralizer may have a total oxygen content in the mineralizer composition less than about 100 parts per million (ppm) by weight.

A mineralizer composition comprising at least one of fluorine and at least one of chlorine, bromine, or iodine is provided in other embodiments.

Moreover, the present disclosure provides a method for forming a gallium nitride crystal structure. The method includes providing a purified mineralizer substantially free from trace impurities to an autoclave or a capsule along with ammonia and a polycrystalline group III metal nitride source material, the trace impurities being less than about 1000 ppm. The method includes processing the polycrystalline group III metal nitride in supercritical ammonia at a temperature greater than 400 degrees Celsius and a pressure greater than 50 MPa to cause formation of one or more crystalline structures being substantially transparent in characteristic. In certain embodiments, the crystalline structures have high purity and are transparent. The crystalline structures may be processed to form one or more group III metal nitride wafers. The group III metal nitride wafers may be used as substrates for devices such as light emitting diodes (LEDs), laser diodes, power diodes, and transistors.

Benefits are achieved over pre-existing techniques using the present disclosure. In particular, the present disclosure enables a cost-effective growth of crystals such as GaN, AlN, InN, InGaN, and AlInGaN and others. In a specific embodiment, the present method and resulting composition can be made using relatively simple and cost effective techniques and apparatus. In a specific embodiment, the resulting mineralizer is substantially pure and can be a starting point for high purity crystals and the like. Depending upon the embodiment, one or more of these benefits may be achieved. These and other benefits may be described throughout the present specification and more particularly below.

The present disclosure achieves these benefits and others in the context of known process technology. However, a further understanding of the nature and advantages of the present disclosure may be realized by reference to the latter portions of the specification and attached drawings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
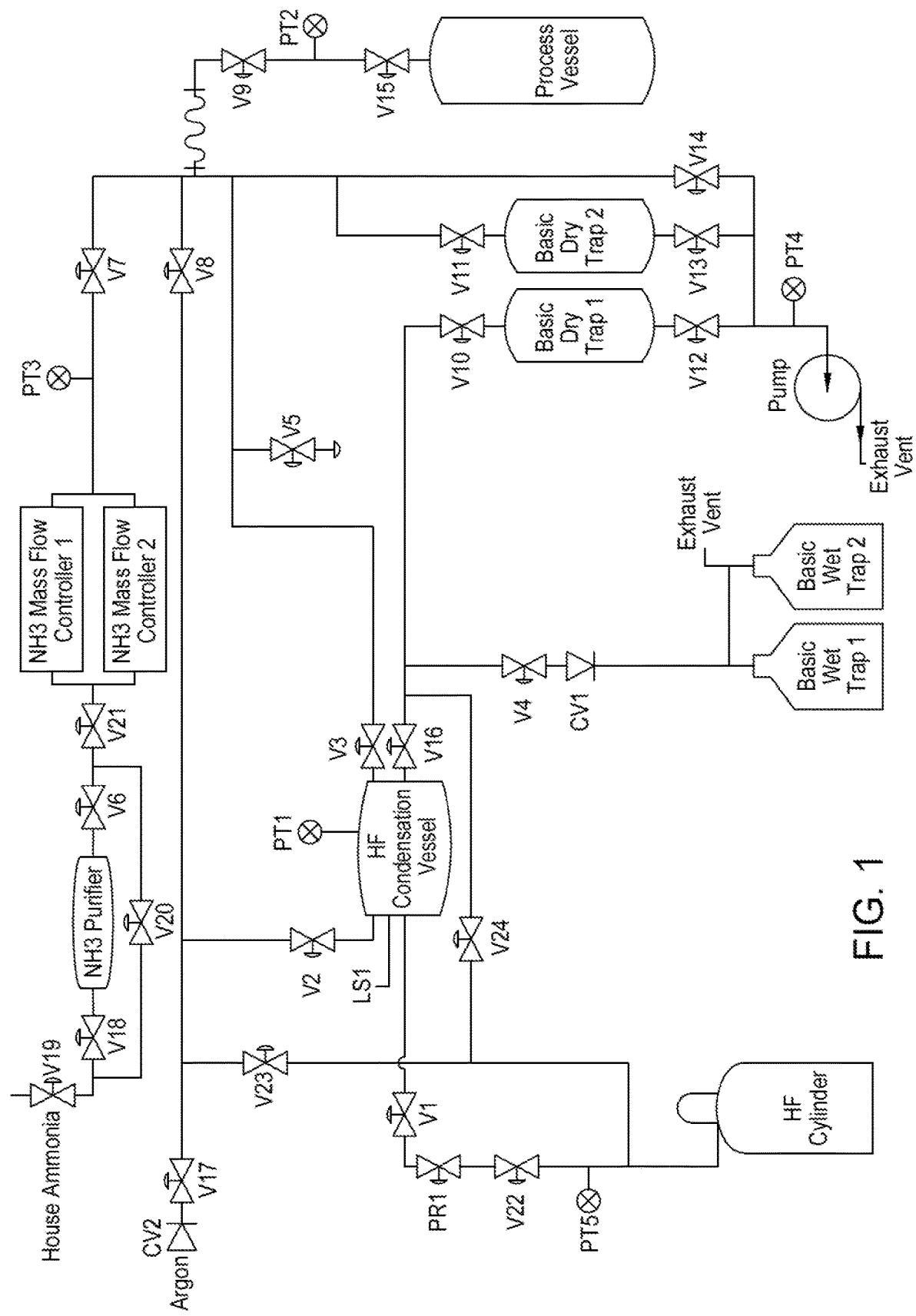
FIG. 1 is a schematic diagram of a system for delivery of a condensable mineralizer composition according to an embodiment of the present disclosure.

According to the present disclosure, techniques related to processing of materials for growth of crystals are provided. More particularly, the present disclosure provides a high purity mineralizer suitable for use as a raw material for crystal growth of a group III metal nitride crystal by an ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, BN, InGaN, AlGaN, AlInGaN, and BAlGaInN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

The disclosure includes embodiments that may relate to a composition. The disclosure includes embodiments that may relate to an apparatus for making a composition. The disclosure includes embodiments that may relate to a method of making and/or using the composition.

Approximating language, as used herein throughout the specification and claims, may be applied to modify any quantitative representation that could permissibly vary without resulting in a change in the basic function to which it may be related. Accordingly, a value modified by a term such as "about" may be not to be limited to the precise value specified. In at least one instance, the variance indicated by the term about may be determined with reference to the precision of the measuring instrumentation. Similarly, "free" may be combined with a term; and, may include an insubstantial number, or a trace amount, while still being considered free of the modified term unless explicitly stated otherwise.

In a specific embodiment, the present disclosure provides a mineralizer composition. The mineralizer includes one or more compositions including fluorine, including hydrogen fluoride (HF), ammonium fluoride ($NH_4F$), ammonium acid fluoride ($NH_5F_2$), gallium fluoride ($GaF_3$) and its diamine complex ($GaF_3 \cdot 2NH_3$) or triamine complex ($GaF_3 \cdot 3NH_3$), and hexafluoroammonium gallate (($NH_4$)$_3GaF_6$). In certain embodiments, the mineralizer includes or consists of a composition comprising two or more of fluorine (F), hydrogen (H), nitrogen (N), and gallium (Ga), or a reaction product between a metal, ammonia, and a hydrogen fluoride or a reaction product between two or more of the compositions. In certain embodiments, a condensable mineralizer composition includes or consists of one or more of $GaCl_3$, $GaBr_3$, and $GaI_3$. The mineralizer may have a total oxygen content in the mineralizer composition less than about 10 parts per million (ppm) by weight, less than about 5 ppm, less than about 2 ppm, less than about 1 ppm, less than about 0.5 ppm, less than about 0.2 ppm, or less than about 0.1 ppm.

The inventors have found that commercially available point-of-use purifiers do not work well with HF and, therefore, that purification by distillation is highly desirable in order to avoid uncontrolled impurity introduction into a gallium nitride bulk crystal growth process. It is common to describe the extent of purification by a distillation process in terms of theoretical plates, where a single condensation/revaporization process corresponds to a single theoretical plate. The disclosed process results in transfer of a portion of a condensable mineralizer composition from a mineralizer source to a receiving vessel that has been purified by a distillation process of at least one theoretical plate, at least two theoretical plates, at least three theoretical plates, at least five theoretical plates, or at least ten theoretical plates.

Referring to FIG. 1, a manifold for delivery of a condensable mineralizer composition is provided. The manifold may comprise a number of valves, tubulation, at least one vacuum pump, one or more traps in series with the at least one vacuum pump, connections to a purge gas, connections to exhaust traps, one or more point-of-use purifiers, one or more transfer vessels into which a condensable mineralizer composition may be condensed, and one or more receiving vessels into which the condensable mineralizer may be delivered. The tubulation and valves for the manifold may comprise stainless steel or a more corrosion-resistant alloy such as Hastelloy®, Monel®, or Inconel®. The tubulation, valves, and other components may be connected by leak-tight fittings. The leak-tight fittings may comprise metal seals, knife-edge-gasket metal seals, rounded-edge-gasket metal seals, O-ring seals, ferrule seals, a combination thereof, or the like. The valves may include non-bonnet-type seals to atmosphere such as bellows or diaphragm seals and through-seals comprising a polymer such as Kel-F or polyimide. In certain embodiments, some components are fabricated from or include a polymeric material such as perfluoroalkoxy alkane (PFA Teflon®), poly(ethylene-co-tetrafluoroethylene) (ETFE), polytetrafluoroethylene (PTFE), fluorinated ethylene propylene (FEP), polyvinylidene fluoride (PVDF), polyvinyl fluoride (PVF), polychlorotrifluoroethylene (PCTFE), ethylene chlorotrifluoroethylene (ECTFE), THV (terpolymer of tetrafluoroethylene, hexafluoropropylene and vinylidene fluoride), other fluoropolymers, or the like. For simplicity of discussion, and not intending to be limiting as to the scope of the disclosure provided herein, various types of useful polymeric materials are often referred to herein as "plastic" materials. In certain embodiments, the manifold is contained within a ventilated enclosure for safety in case of a leak. In certain embodiments, the pump contains a corrosion-resistant fluid such as Krytox®.

The at least one vacuum pump may comprise a conventional rotary oil pump. In other embodiments, the vacuum pump includes a corrosion-resistant fluid such as Krytox®. In some embodiments, the vacuum pump includes or consists of a fluid-free pump such as a diaphragm pump. In certain embodiments, a high-vacuum pump, such as a molecular drag pump or a turbomolecular pump, is provided. The pump(s) may be protected by one or more traps. The traps may be fabricated from a transparent or translucent plastic such as PFA Teflon® and may contain a basic composition, such as pelletized NaOH, KOH, Ca(OH)$_2$, CaCO$_3$, a combination thereof, or the like. In certain embodiments, one or more traps is cooled during operation, for example, to chilled-water temperature, to ice temperature, to dry ice temperature, or to liquid nitrogen temperature.

One or more bubbler traps or wet traps for ventilation to atmospheric pressure, at least two of which may be connected in series, may be fabricated from a transparent or translucent plastic, such as Nalgene, polypropylene, polyethylene, perfluoroalkoxy (PFA) Teflon®, or the like. One or more of the bubbler traps may comprise a basic aqueous solution containing at least one of NaOH, KOH, Na$_2$CO$_3$, NaHCO$_3$, or the like.

The materials of construction of one or more transfer vessels or condensation vessels (for example, "HF Condensation Vessel" in FIG. 1) or manifold components may include one or more of a transparent or translucent plastic, such as perfluoroalkoxy (PFA) Teflon®, stainless steel, nickel, a nickel alloy such as Hastelloy® C-276 or Inconel 600, silver, a silver alloy, Monel® 400, or a precious metal such as gold, platinum, palladium, rhodium, iridium, or ruthenium. In certain embodiments, one or more transfer vessels or manifold components include a coating, such as silver, a precious metal, or a polymer or plastic composition. A coating may be deposited within one or more transfer vessels or manifold components by one or more of electroless plating, electroplating, evaporation, or the like. In preferred embodiments, the first transfer vessel includes metallic components within the vessel, above the vessel, or as an outer portion of the vessel, so that condensation can occur on the metallic component and the associated heat transfer can occur efficiently. In preferred embodiments, metallic surfaces that are exposed to a liquid mineralizer composition, such as liquid HF, are fabricated from a composition that does not form a reaction product when exposed to the liquid mineralizer composition in a liquid phase. In one example, a reaction product may include forming a "patina", a discolored film formed by chemical reaction of the metal with the liquid composition that may spall off and lead to particulate contamination, or suffer significant corrosion during extended operation. "Significant corrosion" or a "significant amount of corrosion" may be defined as loss of thickness of a transfer vessel or manifold component of at least 5 micrometers, at least 25 micrometers, or at least 100 micrometers over extended operation of a period between about 3 months and about ten years. A patina formed on a metallic surface may include or consist of, for example, one or more of FeF$_3$, FeF$_2$, NiF$_2$, CrF$_3$, MoF$_4$, or MoF$_5$. The transfer vessel may have an entrance tube above the body of the vessel with an inner diameter less than about 10 millimeters, less than about 5 millimeters, less than about 3 millimeters, less than about 2 millimeters, or less than about 1 millimeter. The transfer vessel, and/or the entrance tube above it, may be formed from an optically transparent, translucent or at least partially opaque material and include have one or more markings or measurement lines enabling reading of the height of a meniscus of a fluid contained therein.

Preferably, the manifold is fabricated so as to avoid areas or features where liquid mineralizer composition can pool under the effects of gravity and such that the manifold connection to the process vessel is the lowest gravitational point of the assembly. Valves may be oriented horizontally to avoid any liquid pooling when closed. Referring again to FIG. 1, the manifold includes tubulation members with horizontal or vertical orientation. In preferred embodiments, the manifold is free of members or regions with a height, as measured from a reference surface such as a floor, that is a local minimum, that is, where liquid mineralizer formed adventitiously can drip, collect, and form a pool. In preferred embodiments, the manifold layout avoids local minima in the height of individual members of the manifold. In certain embodiments, one or more components of the manifold are enclosed within a heating jacket. In certain embodiments, most or all components of the manifold that are exposed to a condensable mineralizer composition at a pressure greater than about 200 Torr are enclosed within a heating jacket. In some embodiments, the temperatures of one or more of the manifold components are maintained at a temperature that prevents condensation of all of the components of the condensable mineralizer material disposed therein. In certain embodiments, one or more components of the manifold are maintained at a temperature between about 25 degrees Celsius and about 150 degrees Celsius, or between about 30 degrees Celsius and about 50 degrees Celsius, during operation when a condensable mineralizer composition is present.

Figure 2:
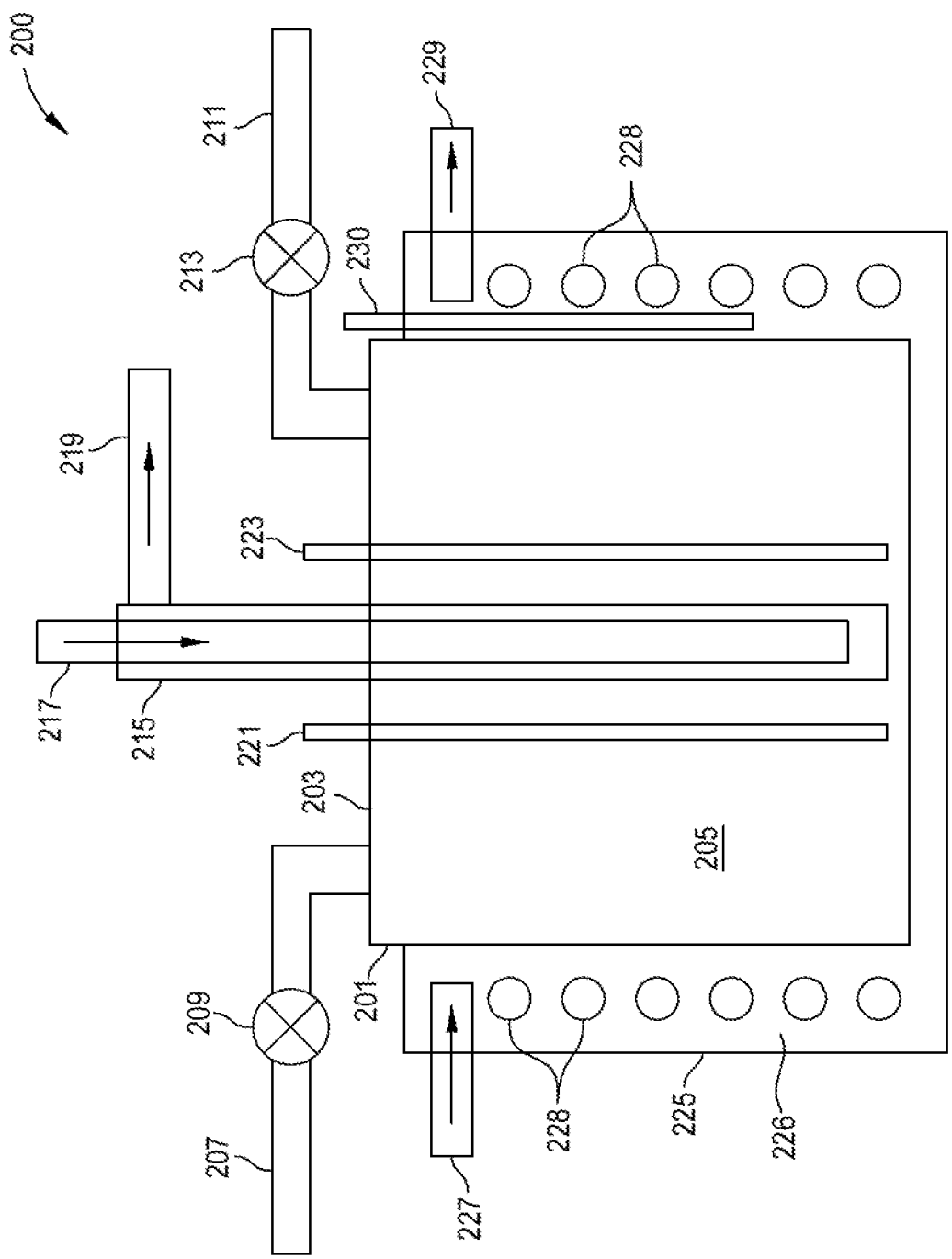
FIG. 2 is a schematic diagram of a transfer vessel for condensation and re-evaporation of condensable mineralizer composition according to an embodiment of the present disclosure.

Referring to FIG. 2, a first transfer vessel 200 may include an outer enclosure 201 and a lid 203, defining an enclosed volume 205. Lid 203 may be attached to enclosure 201 demountably, for example, by means of fasteners together with an o-ring or gasket seal, or non-demountably, for example, by means of welding, brazing, or an adhesive. First transfer vessel 200 may also include a vapor inlet 207 with inlet valve 209, and a vapor outlet 211 with outlet valve 213. In certain embodiments, the first transfer vessel 200 includes an inner heat exchange member 215, with a fluid inlet 217 and a fluid outlet 219. In preferred embodiments, inner heat exchange member 215 consists of or includes a metal that is chemically inert to the condensable mineralizer composition, such as anhydrous HF, and does not suffer significant corrosion under extended use and/or does not readily form a patina upon exposure to fluorine-containing compositions. In certain embodiments first transfer vessel 200 further includes an inner temperature sensor 221 and a fluid level sensor 223. In certain embodiments inner temperature sensor 221 consists of at least one of a thermocouple, a thermistor, and a resistance temperature detector (RTD) and is interfaced to a control system (not shown). In certain embodiments, inner temperature sensor 221 is enclosed within a sheath consisting of or including a polymeric material (e.g., plastic) or a metal that is chemically inert with respect to the condensable mineralizer composition and does not form a patina. In certain embodiments, fluid level sensor 223 consists of or includes at least one of a float type sensor, an electrode type sensor, a differential pressure transducer, a load cell, a magnetic level gauge, a capacitance transmitter, an ultrasonic level transmitter, a laser level transmitter, a guide pulse sensor, and a sensing guide pulse transducer. In certain embodiments, fluid level sensor 223 includes a plastic-encapsulated probe that is at least partially immersed in the condensable mineralizer composition during operation. In certain embodiments, one or more connections to first transfer vessel 200 are flexible and a quantity of condensable mineralizer composition within interior volume 205 is determined gravimetrically, that is, by a weight measurement, rather than volumetrically.

When the inner heat exchange member 215 is present, outer enclosure 201 may be fabricated from plastic or metal, according to preferred design variations. In certain embodiments, heat exchange to or from a condensable mineralizer composition is performed through outer enclosure 201, which includes or consists of a metal, instead of or in addition to inner heat exchange member 215. In certain embodiments, heat exchange through outer enclosure 201 is facilitated by outer heat exchange bath 225, containing bath fluid 226, whose temperature may be changed by a heat exchange fluid flowing into fluid inlet 227, circulating in a heat exchange loop 228 within bath fluid 226, and exiting from heat exchange fluid outlet 229. In certain embodiments one or both of bath fluid 226 and the heat exchange fluid include or consists of one or more of propylene glycol, ethylene glycol, alcohol, and water. The temperature of bath fluid 226 may be monitored by outer temperature sensor 230. In certain embodiments, outer temperature sensor 230 consists of at least one of a thermocouple and a resistance temperature detector (RTD). In certain embodiments, a stirrer (not shown) circulates heat exchange fluid 226. In certain embodiments, fluid inlet 227 feeds fluid directly into the space between outer heat exchange bath and outer enclosure 201 rather than flowing within heat exchange loop 228.

A source of a condensable mineralizer composition, such as anhydrous HF, may be connected to the manifold. A source of purge gas, such as argon (Ar) or nitrogen ($N_2$), may be connected to the manifold. Prior to use, the manifold may be verified to be gas-tight by helium leak-testing or the like.

The manifold may further include one or more sensors. Suitable sensors may include one or more of pressure sensors, such as a vacuum gauge, a Bourdon gauge, an aneroid gauge, or a capacitance manometer, temperature sensors, such as thermocouples or resistance temperature detectors, and gas composition sensors, such as a mass spectrometer or residual gas analyzer. The sensors may be placed within or proximate to the manifold and may communicate certain process parameters within the manifold to a controller, which is described below. In certain embodiments, some or all of the manifold may be held at an elevated temperature, for example, by a heating jacket, heating tapes or heating traces, in order to avoid condensation of the condensable mineralizer composition at previously-selected locations within the manifold. In certain embodiments, the elevated temperature may be selected within the range of 25 to 150 degrees Celsius or within the range of 30 to 50 degrees Celsius.

In certain embodiments, the manifold is filled with a purge gas (such as argon or nitrogen) between uses. The pressure of purge gas within the manifold prior to beginning the filling operation may be between about 0.1 atmosphere and about 5 atmospheres. In alternative embodiments, the manifold is left under vacuum between uses. The vacuum level within the manifold prior to beginning the filling operation may be below about 1 Torr, below about 1 millitorr (mTorr), or below about $10^{-5}$ Torr.

A receiving vessel ("Process Vessel" in FIG. 1) may be attached to the manifold via a leak-tight connection. The receiving vessel may comprise a capsule suitable for ammonothermal crystal growth, such as are described in U.S. Application Publication No. 2009/0301388 and U.S. Pat. No. 10,029,955, and may comprise a fill tube terminated by a valve that is closed when the receiving vessel or capsule is connected to the manifold. The receiving vessel may contain one or more group III metal nitride seed crystals, polycrystalline group III metal nitride nutrient, and one or more baffles. In certain embodiments, the receiving vessel or capsule has been purged and/or evacuated prior to connection to the manifold. In certain embodiments, the receiving vessel or capsule has been baked out, at a temperature between about 50 degrees Celsius and about 800 degrees Celsius, and evacuated to a pressure below about $10^{-2}$ Torr, or below about $10^{-4}$ Torr, prior to connection to the manifold. In certain embodiments, the receiving vessel or capsule is evacuated, purged, and/or baked out before connecting to the manifold or while connected to the manifold. In certain embodiments, purge gas is allowed to flow from the manifold into a fitting coupled to a valve on the receiving vessel while the attachment operation is being performed.

After connecting the receiving vessel or capsule to the manifold, with the valve on the fill tube of the receiving vessel closed, a valve terminating the connection of the manifold to the receiving vessel may be opened and at least a portion of the manifold plus the space between the manifold and the receiving vessel are evacuated. At least a portion of the manifold plus the space between the manifold and the receiving vessel may be back-filled with purge gas and re-evacuated. The back-fill/pump sequence may be repeated, for example, at least about 5 times. During the back-fill portion of a cycle, the manifold pressure may be increased to a range between about 0.5 atmosphere and about 10 atmospheres, or between about 1 atmosphere and about 5 atmospheres. During the pump portion of a cycle, the manifold may be evacuated to a pressure below 1 Torr, below 0.1 Torr, below $10^{-2}$ Torr, below $10^{-3}$ Torr, below $10^{-4}$ Torr, below $10^{-5}$ Torr, below $10^{-6}$ Torr, below $10^{-7}$ Torr, below $10^{-8}$ Torr, or below $10^{-9}$ Torr. After the manifold, including at least one transfer vessel and the connection to the receiving vessel, has achieved a desired vacuum level or has been purged and pumped a predetermined number of times, a valve to the vacuum pump may be closed.

At least a portion of first transfer vessel 200 may be chilled, for example, by flowing a chilled fluid, such as chilled water, a chilled mixture of water and ethylene glycol or propylene glycol, chilled alcohol, acetone, or methylene chloride, or liquid nitrogen, through inner heat exchange member 215 or outer heat exchange member 228 to enable the condensation of the condensable mineralizer composition. Chilling may be accomplished by passing the chilled fluid through an ice bath, a dry ice bath, by means of a closed-cycle refrigerator, or by other means that are known in the art. In certain embodiments, outer enclosure 201 is chilled by immersion in a bath comprising water and ice, dry ice and one of alcohol, acetone, or methylene chloride, or liquid nitrogen, or by means of a closed-cycle refrigerator. One or more valves, including vapor inlet valve 209, between the source of a condensable mineralizer composition, such as HF, and the first transfer vessel 200 is opened, and vapor from the condensable mineralizer composition is allowed to flow from the source vessel into the chilled first transfer vessel 200 and allowed to condense therein. The pressure of vapor-phase condensable mineralizer composition may be between about 1 Torr and about 10 atmospheres during the transfer operation. In certain embodiments, the duration of the vapor transfer process is chosen by comparison of the level of the meniscus of the condensed mineralizer composition within the first transfer vessel 200 to a reference position on the first transfer vessel. In certain embodiments, the duration of the vapor transfer process to the first transfer vessel 200 is chosen by targeting a predetermined fluid level, as measured by fluid level sensor 223. In certain embodiments, the source vessel containing the condensable mineralizer composition, such as a cylinder of HF, and the tubulation and valves connecting it to the first transfer vessel 200, are heated to a temperature between about 20 degrees Celsius and about 400 degrees Celsius, or between about 25 degrees Celsius and about 100 degrees Celsius, in order to facilitate the vapor phase transfer process. In certain embodiments, the vapor of the condensable mineralizer composition passes through a point-of-use purifier, which may comprise a getter, prior to condensing in the first transfer vessel 200. The point-of-use purifier may be heated, to a temperature between about 30 degrees Celsius and about 400 degrees Celsius, or between about 30 degrees Celsius and about 100 degrees Celsius, in order to facilitate the vapor phase transfer process. In certain embodiments, the first transfer vessel also contains a getter, for additional purification of the condensable mineralizer composition prior to transfer to the receiving vessel. In one specific embodiment the getter comprises at one of $CoF_2$, $ZnF_2$, $ZrF_4$, $HfF_4$, Hg, Cu, Ag, and Au.

After the desired amount of condensable mineralizer composition has been vapor-phase transferred to the first transfer vessel 200, one or more valves between the condensable mineralizer source vessel and the first transfer vessel 200, including inlet valve 209, may be closed. The first transfer vessel 200 and one or more of inner heat exchange member 215 and outer heat exchange member 228, if present, may then be warmed, for example, to room temperature to cause at least a portion of the condensed mineralizer composition to vaporize and to prepare for a subsequent transfer process.

In certain embodiments, it may be desirable to remove some of the condensable mineralizer composition from the first transfer vessel 200 prior to transferring it to the receiving vessel. For example, measurement of the amount of condensable mineralizer composition may be accomplished volumetrically, either by means of fluid level sensor 223 or by comparing the height of the meniscus of the condensable mineralizer composition to one or more reference marks on the first transfer vessel 200 while the first transfer vessel is held at a predetermined temperature, for example, room temperature, as measured by temperature sensor 221. One or more valves separating the first transfer vessel 200 from a liquid trap may be opened, and one or more valves to a purge gas source may be opened, causing purge gas to flow over the condensable mineralizer composition within the first transfer vessel 200, mixing with vapor from the condensable mineralizer composition, and passing into the liquid trap(s). The pressure of the purge gas may be between about 1.1 atmosphere and about 5 atmospheres during a purge operation. The flow rate of purge gas may be throttled to maintain an acceptable rate of bubbling and heat generation within the liquid trap(s). In certain embodiments, one or more check valves prevents back-flow of gas or vapor from the liquid trap into the manifold or from the manifold into the purge gas source line. The flow of purge gas may be terminated by closing one or more valves when the quantity of condensable mineralizer composition within the first transfer vessel 200 has decreased to the desired level. In certain embodiments, a portion of the condensable mineralizer composition within the first transfer vessel 200 is removed by partial evacuation, for example, by opening one or more valves separating the first transfer vessel 200 from a vacuum pump for a controlled period of time. In certain embodiments, the vacuum pump is protected from the corrosive condensable mineralizer composition by a dry trap, for example, pellets of at least one of sodium hydroxide, potassium hydroxide, calcium hydroxide, and calcium carbonate.

In certain embodiments, some or all of the condensable mineralizer composition is then transferred from the first transfer vessel 200 to at least one of a second transfer vessel and the receiving vessel. In certain embodiments this transfer operation is carried out in the vapor phase, by chilling at least one of the second transfer vessel and the receiving vessel and, optionally, heating the first transfer vessel 200. In certain embodiments, a vapor phase transfer is performed with a pressure of a condensable mineralizer composition between about 50 Torr and about 2 atmospheres, or between about 200 Torr and about 1 atmosphere with the manifold. In certain embodiments this transfer operation is carried out in the liquid phase, for example, by opening one or more valves and allowing the (liquid) condensable mineralizer composition to flow into the second transfer vessel. In certain embodiments, the amount of condensable mineralizer composition to be delivered to the receiving vessel is measured by determining a change in fluid level using fluid level sensor 223 or by comparing a position of the meniscus of the condensable mineralizer composition with one or more reference marks formed on or adjacent to a transparent or translucent portion of the first transfer vessel 200. In certain embodiments, it may be desirable to remove some of the condensable mineralizer composition from the second transfer vessel prior to transferring it to the receiving vessel. One or more valves separating the second transfer vessel from a liquid trap may be opened, and one or more valves to a purge gas source may be opened, causing purge gas to flow over the condensable mineralizer composition within the second transfer vessel, mixing with vapor from the condensable mineralizer composition, and passing into the liquid trap. The flow of purge gas may be terminated by closing one or more valves when the quantity of condensable mineralizer composition within the second transfer vessel has decreased to the desired level. In certain embodiments, the quantity of condensable mineralizer composition within the second transfer vessel is determined gravimetrically. In certain embodiments, the second transfer vessel is attached to the manifold by a flexible connection and the weight of condensable mineralizer composition is determined by weighing the second transfer vessel before and after a transfer of condensable mineralizer composition. In other embodiments, the quantity of condensable mineralizer composition is determined by disconnecting the second transfer vessel from the manifold (after multiple cycles of pumping and purging), weighing with versus without the condensable mineralizer composition present, and re-connecting the second transfer vessel to the manifold (with multiple cycles of pumping and purging).

In certain embodiments, the quantity or amount of condensable mineralizer within the first transfer vessel 200 is measured via level sensor 223. The level sensor 223 may communicate a measured height of the condensable mineralizer composition in the first transfer vessel 200 to a controller (not shown), which can convert the height signal to a volume and a mass of mineralizer using either internal temperature sensor 221 or external temperature sensor 230. The conversion of the height into a mass of mineralizer can be calibrated with water and by using the appropriate temperature-dependent HF density conversion. In configurations where the height and temperature are measured in real time via the controller, the temperature can fluctuate during transfer of the condensable mineralizer composition without impeding accurate measurement of the (temperature dependent) mineralizer mass. In some embodiments this temperature can be stabilized before condensation or transfer, for example, by pausing for a period between about one second and about one minute. In embodiments where the level sensor has blind spots or "dead zones" near the top and/or bottom of the level sensor the amount of mineralizer initially condensed must take into account both this "bottoms" amount and the amount to be transferred into the process vessel or capsule. When the desired amount of mineralizer is condensed into first transfer vessel 200 the amount condensed can be remeasured and stored as the starting volume before transferring to the receiving vessel. The level sensor equations can be described as follows.

| Value | Formula |
| --- | --- |
| Level sensor height | $LS_{meas}$ = signal conversion * $LS1_{signal}$ + signal offset |
| Mineralizer liquid temperature | $T[K] = TC - 1_{meas}[°C.] + 273.15$ |
| Mineralizer transfer volume set point | $V_{mineralizer}(T) = W_{mineralizer}/\rho_{mineralizer}(T)$ |
| Upper distillation set point height | $USP = V_{mineralizer}(T)/A_{cross\ section\ of\ final\ transfer\ vessel} + H_{mineralizer\ below\ sensor}$ |
| Lower transfer set point height | $LSP = H_{initial} * (\rho_{mineralizer}(T)/\rho_{initial}) - [V_{mineralizer}(T)/A_{cross\ section\ of\ final\ transfer\ vessel}]$ |

The transfer process of the condensable mineralizer composition may be repeated, for example, to a third, a fourth, or more transfer vessels. In some embodiments, one or more of the additional transfer processes are carried out via the vapor phase and via condensation.

Figure 3:
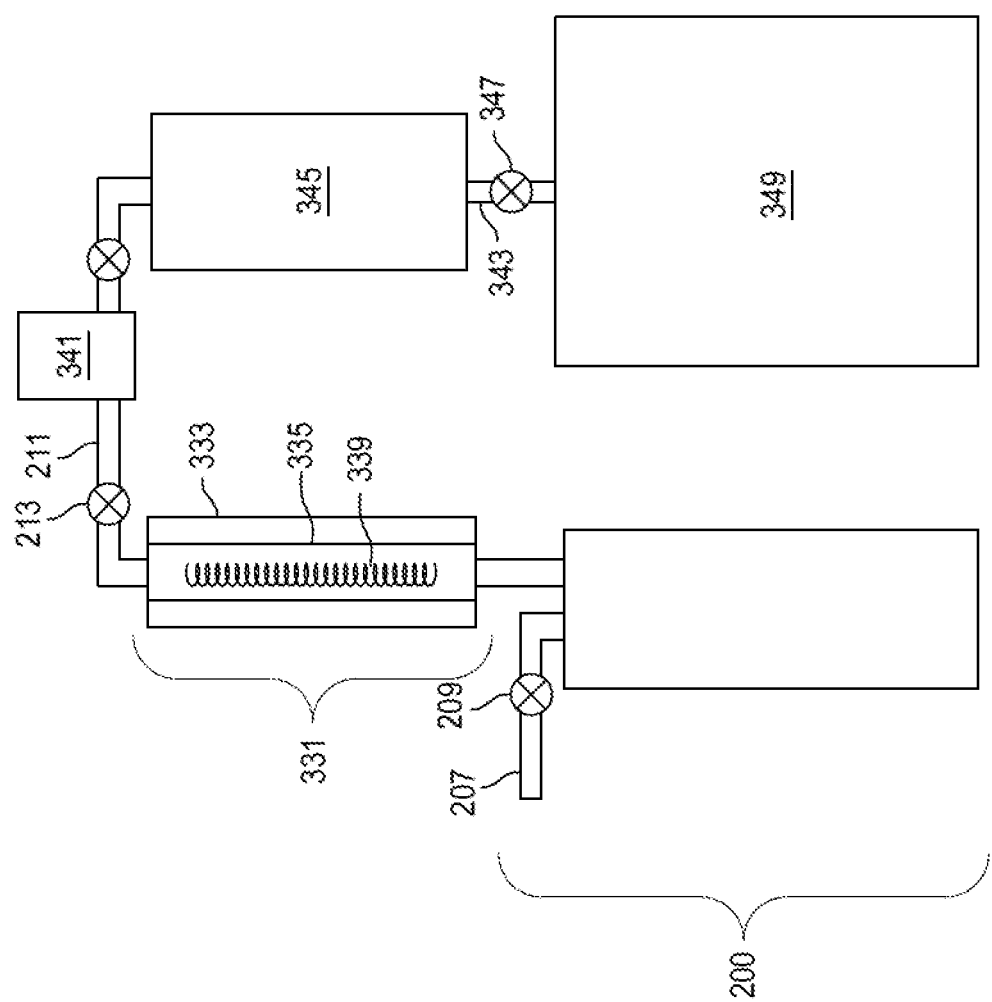
FIG. 3 is a schematic diagram of a transfer vessel for condensation, re-evaporation, and purification by fractional distillation according to an embodiment of the present disclosure.

In certain embodiments, the effluent vapor from at least one of first transfer vessel 200, a second transfer vessel, or an additional transfer vessel, is purified further by means of fractional distillation. In certain embodiments, the pressure of the effluent vapor may be between about 50 Torr and about 2 atmospheres, or between about 200 Torr and about 1 atmosphere, during a fractional distillation process. In certain embodiments, as shown schematically in FIG. 3, fractionating column 331 is positioned above or downstream of a transfer vessel, such as first transfer vessel 200. Fractionating column 331 may include a thermal insulating sleeve 333. In certain embodiments, thermal insulating sleeve 333 provides structural support to enclosure 335 of fractionating column 331, which may be thin to minimize axial heat transfer and allow a temperature gradient to build up in fractionating column 331. Fractionating column 331 may further include packing material 339, to facilitate multiple steps of condensation and re-evaporation, with excess condensed portions of a condensable mineralizer composition dripping back into the transfer vessel from which it evaporated. In other embodiments, fractionating column 331 contains alternative internal components, such as one or more of disks, trays, bubble caps, and sponge. In certain embodiments, one or more of the components of fractionating column 331 consist of or include materials that are inert to the condensable mineralizer composition, such as silver or another metal that does not suffer significant corrosion after extended use or readily form a patina, or a plastic such as PFA Teflon® or ETFE. The temperatures of regions within fractionating column 331 may be between about −20 degrees Celsius and about 50 degrees Celsius, or between about 0 degrees Celsius and about 35 degrees Celsius, during a vapor transfer process. In certain embodiments, effluent vapor of the condensable mineralizer composition passes through mass flow controller 341 before or after passing through fractionating column 331. In certain embodiments, an output signal provided from the mass flow controller 341, which is proportional to the flow rate of the vapor passing through the mass flow controller, is integrated over time to provide a means for precisely metering and determining a quantity of condensable mineralizer composition that is transferred to the receiving vessel. In certain embodiments, portions of mass flow controller 341 that are wetted by a process vapor are held at a temperature between about 25 degrees Celsius and about 150 degrees Celsius during a vapor transfer process, or between about 30 degrees Celsius and about 50 degrees Celsius.

Figure 8:
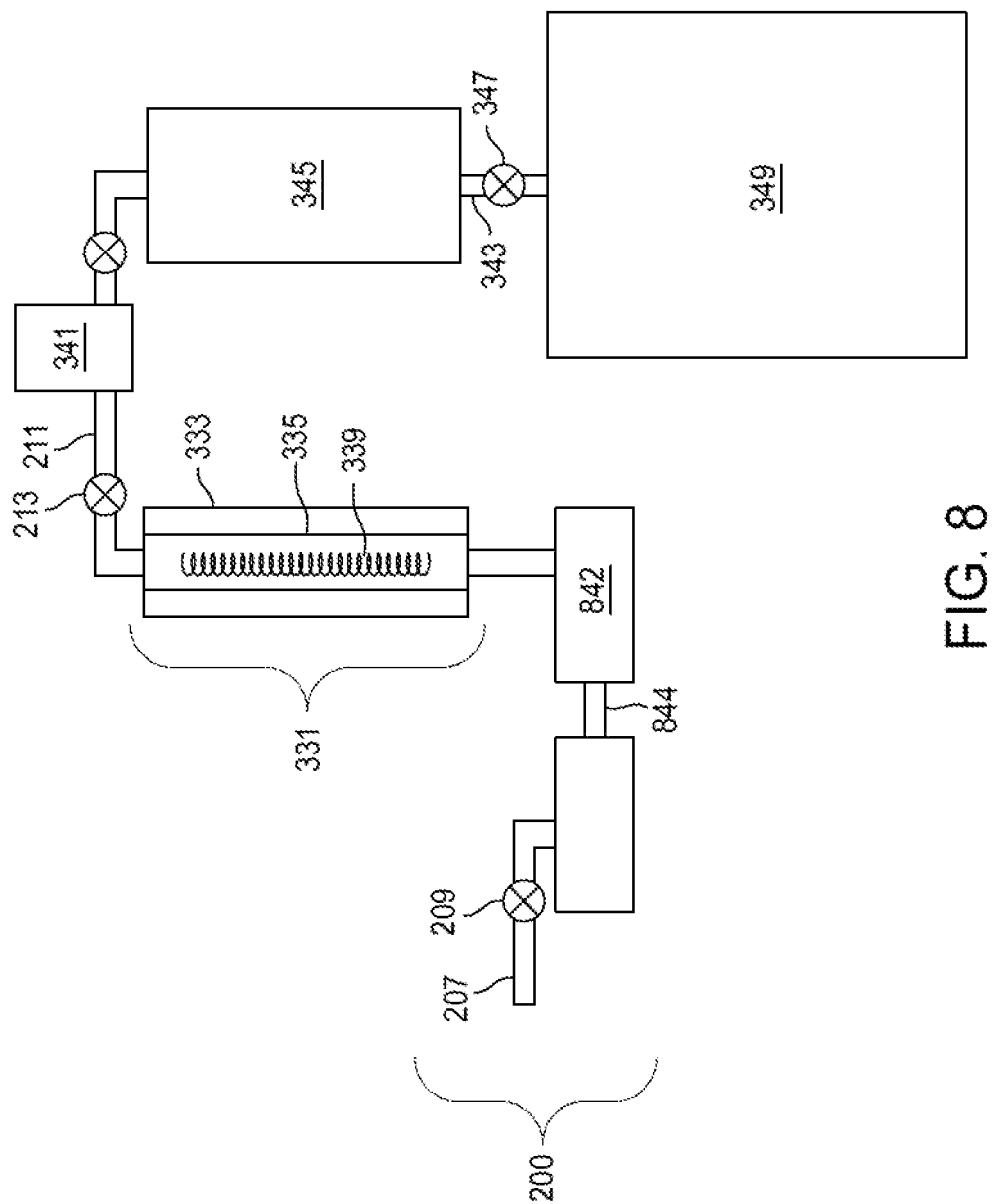
FIG. 8 is a schematic diagram of a fill system for a mineralizer composition according to an embodiment of the present disclosure.

In certain embodiments, as shown schematically in FIG. 8, a condensable mineralizer composition is caused to condense in first transfer vessel 200 and is allowed to flow into second transfer vessel 842 through connection 844 as a liquid, without first determining the quantity of fluid in first transfer vessel 200 volumetrically or gravimetrically. In preferred embodiments, second transfer vessel 842 and connection 844 consists of or includes a metallic composition that does not suffer significant corrosion after extended use or form a patina or scale by reaction with the condensed mineralizer composition in a liquid phase. As discussed above, in some embodiments, the metallic composition is configured not to form a reaction product when exposed to the condensable mineralizer composition in a liquid phase. In one example, the metallic composition is configured not to suffer corrosion corresponding to a loss of thickness greater than 5 micrometers, greater than 25 micrometers, or greater than 100 micrometers after use over a period of at least 3 months or form a patina or composition by reaction with the condensable mineralizer composition. Second transfer vessel 842 may be heated to or held at a temperature higher than that of first transfer vessel 200 and of one or more downstream vessels during a fluid transfer operation, so that vapor passes upward from second transfer vessel 842 into fractionating column 331 and through mass flow controller 341, whose output may be integrated over time to quantify the amount of mineralizer transferred. In this way, a continuous transfer of condensable mineralizer may be achieved while simultaneously achieving significant purification. In certain embodiments, first transfer vessel 200 is held at a temperature between about −20 degrees Celsius and about 20 degrees Celsius during a transfer operation and second transfer vessel 842 is held at a temperature that is higher, by between 1 degree Celsius and 20 degrees Celsius, than first transfer vessel 200. In certain embodiments, first transfer vessel 200 consists of or includes a section of tubulation that may be cooled. In certain embodiments, second transfer vessel 842 consists of or includes a bottom portion of fractionating column 331. In certain embodiments, the quantity of mineralizer that has passed through fractionating column 331 is determined gravimetrically, for example, by condensation into a final transfer vessel 345 (see FIG. 3) or, alternatively, a third transfer vessel (not shown), and weighing, rather than by means of mass flow controller 341.

In certain embodiments, a final transfer vessel upstream of the receiving vessel is configured for liquid-phase transfer of the condensable mineralizer composition to the receiving vessel. Referring again to FIG. 3, in one specific embodiment, an outlet tube 343 on a final transfer vessel 345 extends approximately to the bottom of the interior of the final transfer vessel 345. In certain embodiments, final transfer vessel 345 can be cooled and warmed via at least one of an inner heat exchange member and an outer heat exchange bath, similar to the case for first transfer vessel 200, described above. In another specific embodiment, the final transfer vessel 345 is configured with a valve 347 on its bottom end, so that the condensable mineralizer composition can flow into the receiving vessel 349 in liquid form when the valve 347 is opened. In certain embodiments, final transfer vessel is heated to a temperature between about 2 degrees Celsius and about 50 degrees Celsius, or between about 5 degrees Celsius and about 25 degrees Celsius, higher than that of the receiving vessel 349 during a liquid transfer operation. In this way, as is apparent from the vapor pressure data shown in FIG. 6 for the case of HF, a vapor pressure of the condensable mineralizer composition in final transfer vessel 345 will be significantly higher than a vapor pressure of the mineralizer in receiving vessel 349 that forms as soon as a liquid transfer process is initiated and, therefore, liquid transfer can continue by compression of the vapor in receiving vessel 349 rather than needing to allow escape of vapor from receiving vessel 349, for example, by bubbling.

When the desired quantity of condensable mineralizer composition is contained within the final transfer vessel (which, in certain embodiments, is first transfer vessel 200), upstream valves are closed, one or more valves separating the final transfer vessel from the receiving vessel are opened, and the condensable mineralizer composition is transferred from the final transfer vessel to the receiving vessel. In certain embodiments the receiving vessel is chilled to facilitate the transfer. In certain embodiments, the temperature of the receiving vessel is between about 77 degrees Kelvin and about 320 degrees Kelvin during the transfer, or between about −80 degrees Celsius and about 30 degrees Celsius. In certain embodiments the final transfer vessel and the valves and line(s) connecting the final transfer vessel to the receiving vessel are heated, for example, to a temperature between about 25 degrees Celsius and about 150 degrees Celsius or between about 30 degrees Celsius and about 50 degrees Celsius, to facilitate the transfer. This transfer can be surprisingly quick, requiring less than about 60 min or about 20 min due to the high thermal conductivity of the first transfer vessel and of the receiving vessel, particularly when these vessels include or consist substantially of silver. In certain embodiments, the vapor pressure of condensable mineralizer composition in the final transfer vessel causes liquid-phase transfer of most of the condensable mineralizer composition from the final transfer vessel to the receiving vessel.

The quantity of condensable mineralizer composition transferred to the receiving vessel may be between about 0.1 milliliter and about 100 liters, or between about 1 milliliter and about 10 liters. Transfer of quantities larger than about 10 milliliters is facilitated by heating one or more vessels and tubulation during vapor-phase transfer to maintain a vapor pressure of the condensable mineralizer composition above atmospheric pressure.

After transfer of the condensable mineralizer composition to the receiving vessel is complete, the valves between the final transfer vessel and the receiving vessel may be closed and the connection between the two valves opened. Residual condensable mineralizer composition remaining within the manifold may be removed by passing purge gas through the manifold followed by evacuation and back-filling cycles with purge gas while heating. The manifold may then be left filled with a predetermined pressure of purge gas or under vacuum. The receiving vessel may then be connected to a separate manifold for filling with ammonia.

This approach offers a number of advantages over prior-art methods. The intentional vapor transfer and re-condensation enable accurate metering of the condensable mineralizer composition without having to rely on a mass flow controller, whose calibration factor for the condensable mineralizer composition may not be known, and avoids unintentional condensation and clogging of a transfer line, as might occur with a simple vapor-phase transfer process such as that described by Mikawa et al. The distillation process itself provides additional purification, as the vapor pressures of the condensable mineralizer composition and potential impurities such as $O_2$ and $H_2O$ will be substantially different. In addition, getters can be added to a transfer vessel for purification without fear of contamination of the downstream process, as long as the getter and its reaction products with oxygen or other undesired impurities are non-volatile. Commercial grades of condensable mineralizer compositions such as HF and $GaCl_3$ typically contain at least a few parts per million and up to a percent or more of impurities such as $O_2$, $H_2O$, plus metals, and additional purification is therefore highly desirable.

Rigorous exclusion of air and moisture from the manifold enables higher purity mineralizer and avoids corrosion of the interior surfaces of the manifold by the condensable mineralizer composition. Removal of significant quantities of liquified condensable mineralizer composition by flowing purge gas into a liquid bubbler trap rather than evacuation greatly extends the life of the dry trap and of the vacuum pump(s) and avoids pumpdown issues associated with buildup of condensable vapors within the pump oil. Use of a basic composition such as an alkali hydroxide in wet and dry traps protects the pump(s) against undesirable exposure to the condensable mineralizer composition and minimizes or avoids release of the condensable mineralizer composition to ambient air.

In certain embodiments it is necessary to remove mineralizer from first transfer vessel 200 for maintenance and to optimize the purity of the mineralizer transfer process. For example, in the case where the condensable mineralizer composition consists of or includes HF, the "bottoms" fraction left over in first transfer vessel 200 after vapor-phase transfer of a portion of the condensable mineralizer composition downstream, will be enriched in water by comparison to the transferred composition. Therefore, in preferred embodiments, the bottoms fraction is removed prior to initiation of another transfer operation. Residual condensed mineralizer can be disposed of via a purge operation, using an inert carrier gas transferred to an alkaline wet trap.

In certain embodiments, the purity of a transferred condensable mineralizer composition may be sampled prior to introduction to receiving vessel 349. For example, referring again to FIG. 1, a sampling vessel (not shown) may be connected to valve V5 on the manifold. The sampling vessel may be chilled, causing condensation of a condensable mineralizer composition within the sampling vessel before or after purification by one or more distillation processes or by fractional distillation. In one specific embodiment, the concentration of residual water in the condensable mineralizer composition is quantified by measuring its electrical conductivity, for example, as described by N. Miki et al., J. Electrochem. Soc. 137, 787 (1990). In another specific embodiment, the concentration of residual water in the condensable mineralizer composition is quantified by one of Fourier transform infrared (FTIR) spectroscopy, mass spectrometry, gas chromatography, conductivity, or the like. In certain embodiments, the number of theoretic plates of purification are calculated by comparing the concentration of water in the purified mineralizer to that in the vapor received directly from the mineralizer source. If the purity of a purified condensable mineralizer composition is found to be unacceptable, in some embodiments, at least a portion of the condensable mineralizer composition may be vapor-transferred (distilled) back to first transfer vessel 200 and another cycle of purification may be performed. In some embodiments, the distillation purification system provides at least two, at least three, at least five, or at least ten theoretical plates of purification.

In certain embodiments, one or more additional mineralizer compositions may be added to the receiving vessel or capsule, including HCl, HBr, HI, $Cl_2$, $Br_2$, $I_2$, $GaCl_3$, $GaBr_3$, and $GaI_3$. In certain embodiments, the additional mineralizer compositions are transferred by vapor-phase transport, with condensation into at least one transfer vessel. In certain embodiments, the additional mineralizer compositions may be transferred by vapor-phase transport directly into the receiving vessel or capsule, for example, using a mass flow controller to meter the quantify the amount of mineralizer composition transferred. In certain embodiments, the additional mineralizer composition is transferred as a liquid.

In certain embodiments, following transfer of a predetermined and precisely-metered quantity of condensable mineralizer composition to the receiving vessel or capsule, ammonia may be transferred to the capsule after connecting the receiving vessel or capsule to a separate manifold for ammonia delivery.

Figure 4:
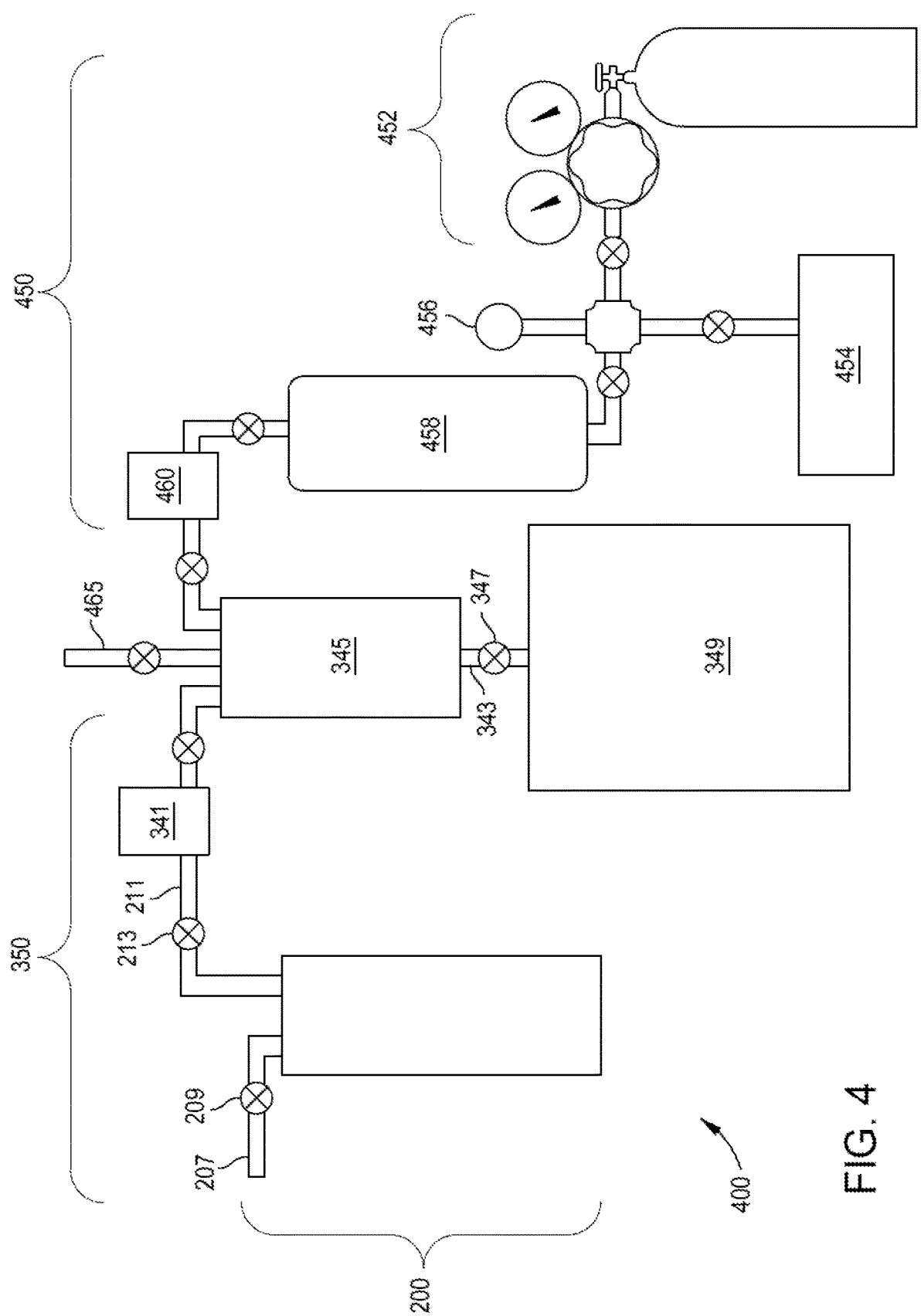
FIG. 4 is a schematic diagram of a fill system for a mineralizer composition and for ammonia according to an embodiment of the present disclosure.

In certain embodiments, a condensable mineralizer composition and ammonia are added to the receiving vessel using an integrated manifold 400, as shown schematically in FIG. 4. Integrated manifold 400 may include a condensable mineralizer manifold 350, described in detail above, together with an ammonia manifold 450. Ammonia manifold 450 may include one or more of an ammonia source 452, a vacuum pump 454, a pressure gauge 456, a point-of-use purifier 458, and a mass flow controller 460. Since ammonia and HF react readily at room temperature to form $NH_4F$, it is important that the integrated manifold 400 include capability to exclude the possibility that HF and ammonia are present in the same location, with the exception of the receiving vessel 349, at a given point in time. In certain embodiments, some or all of the non-cooled components of condensable mineralizer manifold 350 may be held at elevated temperature, for example, between about 25 degrees Celsius and about 150 degrees Celsius, or between about 30 degrees Celsius and about 50 degrees Celsius, to prevent condensation of HF at undesirable locations. In certain embodiments, a purge gas such as argon is admitted through purge inlet 465 to flush the ammonia manifold 350, final transfer vessel 345, and any additional components in which a condensable mineralizer composition may be present at some points in a process cycle prior to admission of ammonia. In certain embodiments, the purge gas may be admitted to a pressure between about 0.5 atmosphere and about 10 atmospheres, or between one atmosphere and about 5 atmospheres. In certain embodiments, the purge gas is evacuated to a pressure below about 0.1 Torr, below about $10^{-2}$ Torr, below about 10.3 Torr, below about $10^{-4}$ Torr, or below about 10.5 Torr. In certain embodiments, at least two, at least three, or at least five pump/purge cycles are performed. In certain embodiments, at least one component within condensable mineralizer manifold 350 and final transfer vessel 345 is heated, and the pressure monitored, to verify that no condensed mineralizer composition, such as liquid HF, is present.

In certain embodiments, ammonia is transferred into the receiving vessel or capsule by a vapor-phase transfer process. For example, referring again to FIG. 4, following removal of the condensable mineralizer composition from the portion of condensable mineralizer manifold 350 that will be exposed to ammonia and, if present, final transfer vessel 345, the manifold up to valve 347 may be evacuated. Ammonia manifold 450 may be purged and evacuated. In certain embodiments, at least two, at least three, or at least five pump/purge cycles are performed. Receiving vessel 349 may be chilled, for example, to approximately dry ice temperature, which will also reduce the vapor pressure of the condensable mineralizer already present in receiving vessel 349 to a very low level. In certain embodiments, the temperature of receiving vessel 349 is between about 77 degrees Kelvin and about 320 degrees Kelvin, or between about −80 degrees Celsius and about 30 degrees Celsius, during an ammonia transfer process. One or more valves between ammonia source 452 and valve 347 may be opened, enabling the ammonia to fill the ammonia manifold. Then valve 347 may be opened, enabling ammonia gas to flow through point-of-use purifier 458, being metered and controlled by mass flow controller 460, and condensing as a liquid in receiving vessel 349.

Figure 5:
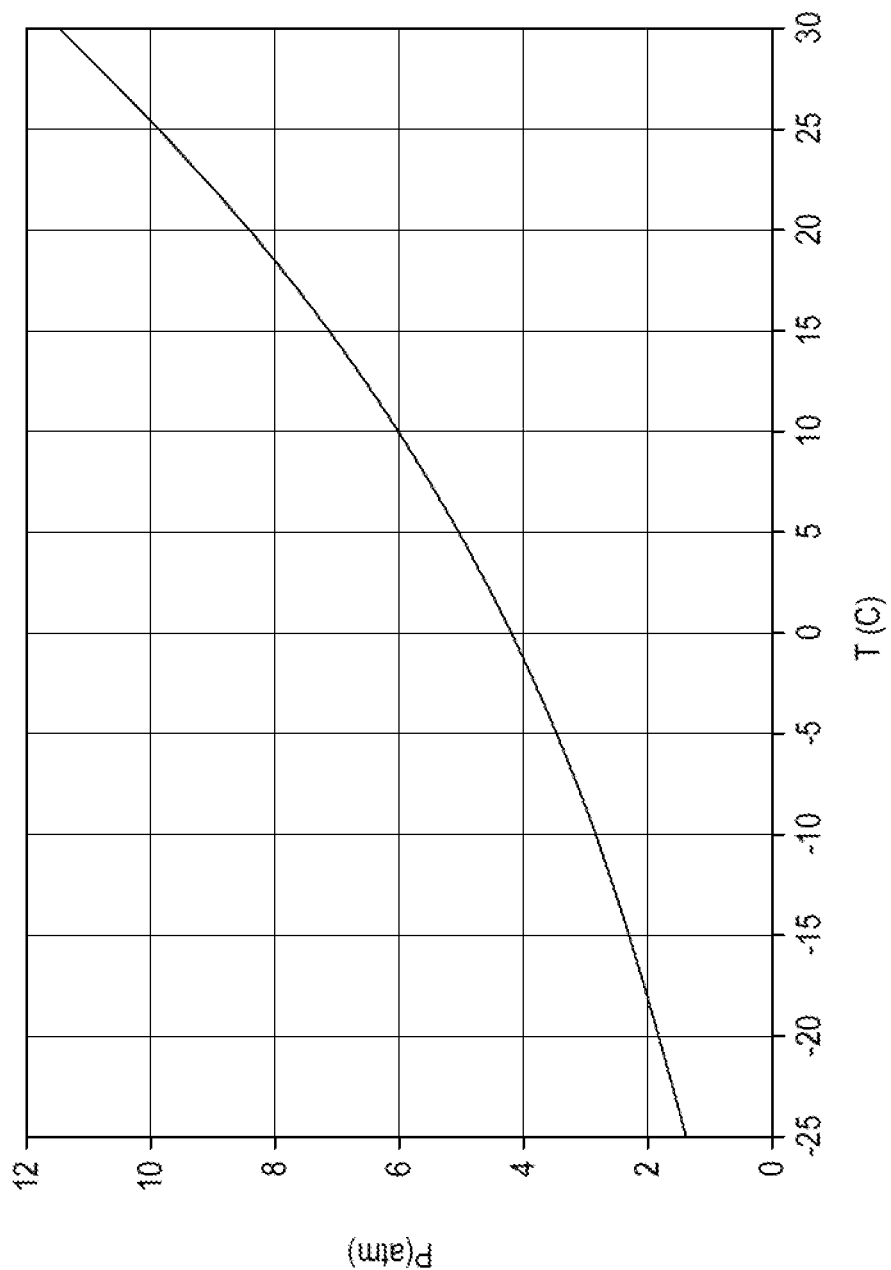
FIG. 5 is a graph showing the equilibrium vapor pressure of ammonia as a function of temperature.
Figure 6:
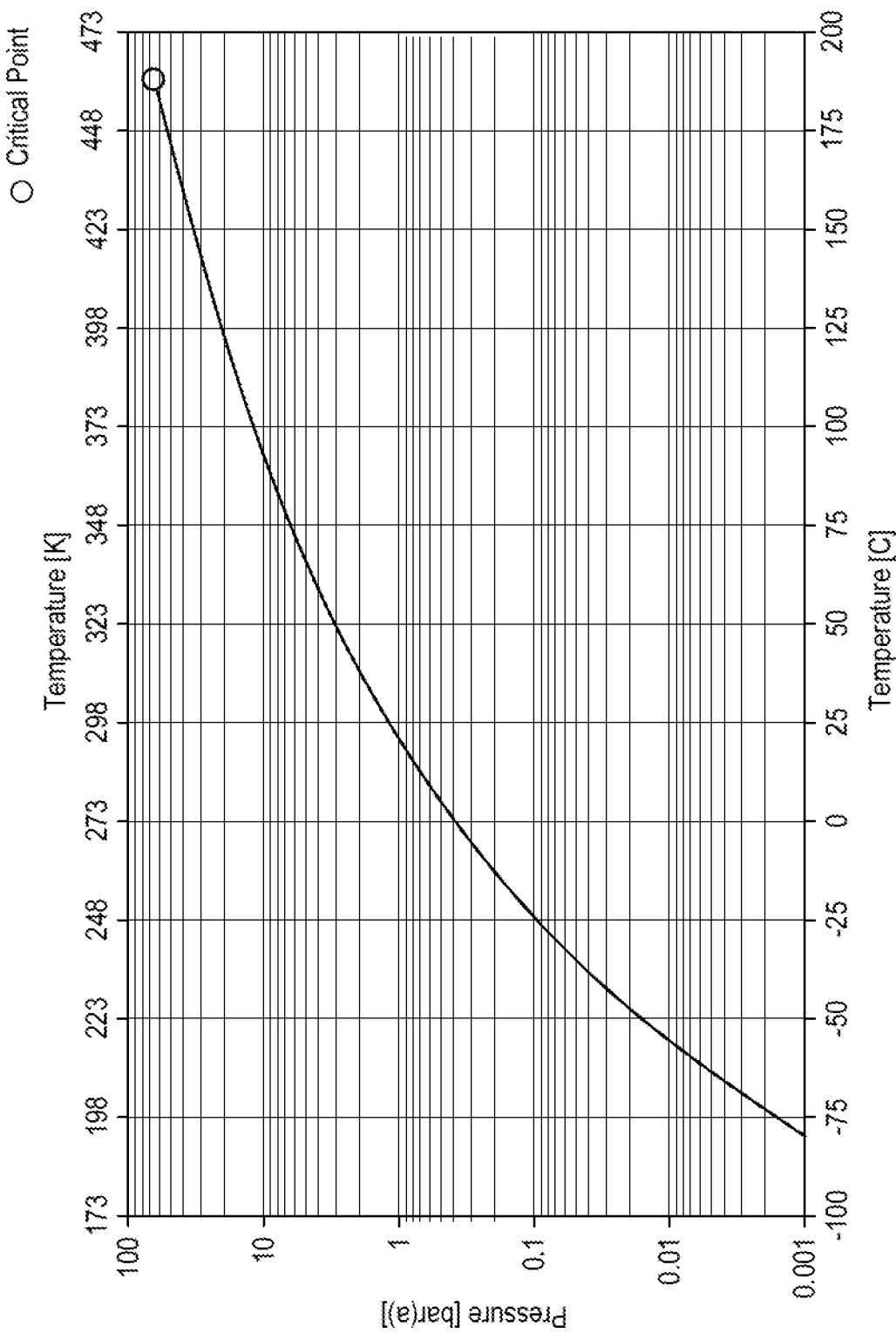
FIG. 6 is a graph showing the equilibrium vapor pressure of hydrogen fluoride as a function of temperature.

In certain alternative embodiments, ammonia is transferred into receiving vessel 349 by a liquid-phase transfer process. For example, referring again to FIG. 4, following removal of the condensable mineralizer composition from final transfer vessel 345, final transfer vessel 345 may be evacuated. In certain embodiments, final transfer vessel 345 is chilled, for example, to approximately dry ice temperature, and one or more valves between ammonia source 452 and final transfer vessel 345 are opened. Ammonia gas flows through point-of-use purifier 458, is metered and controlled by mass flow controller 460, and condenses as a liquid in final transfer vessel 345. In certain embodiments final transfer vessel 345 is chilled to a higher temperature, for example, between about −20 degrees Celsius and about 15 degrees Celsius. Referring to FIG. 5, which shows the vapor pressure of liquid ammonia as a function of temperature, as long as the pressure of ammonia in the ammonia manifold is above the vapor pressure of ammonia at the temperature of the final transfer vessel 345, liquid ammonia will condense in final transfer vessel 345. For example, if the temperature of the final transfer vessel 345 is −10 degrees Celsius, which can be achieved using a salt/water/ice bath, the pressure of ammonia in the ammonia manifold should be maintained higher than about 3 atmospheres; at 0 degrees Celsius the pressure should be maintained higher than about 4.5 atmospheres, and at 10 degrees Celsius the pressure should be maintained higher than about 6 atmospheres. The pressure of ammonia in the ammonia source 452 can be maintained above about 10 atmospheres by maintaining the temperature of ammonia source 452 above about 25 degrees Celsius. Additional details of potential ammonia filling processes are described in U.S. Pat. No. 8,021,481, which is hereby incorporated by reference in its entirety. After the desired amount of ammonia has been added to final transfer vessel 345, for example, by integrating the output of the point-of-use purifier 458, the final transfer vessel 345 may be warmed to about 25 degrees Celsius, about 30 degrees Celsius, or higher, if desired. If receiving vessel 349 is approximately at room temperature, it may contain HF vapor at a pressure near one atmosphere, as shown in FIG. 6, which is a graph of the vapor pressure of HF as a function of temperature. As a consequence, when valve 347 is opened to receiving vessel 349, as ammonia begins to flow from final transfer vessel 345 to receiving vessel 349, solid $NH_4F$ will immediately begin to form and will continue to form until the HF vapor and liquid in receiving vessel 349 have been fully converted to $NH_4F$ (and/or $NH_5F_2$). $NH_4F$ that is formed initially may be entrained by flowing, liquid ammonia, present at a pressure higher than 7 atmospheres, or higher than 10 atmospheres, depending on the temperature of the final transfer vessel 345, and carried into receiving vessel 349. Any residual $NH_4F$ in final transfer vessel 345 or in the tubulation or valve between it and receiving vessel 349 may be transferred by heating to a temperature between about 100 degrees Celsius and about 250 degrees Celsius. In certain embodiments, final transfer vessel 345 is heated to a temperature between about 2 degrees Celsius and about 50 degrees Celsius, or between about 5 degrees Celsius and about 25 degrees Celsius, higher than that of the receiving vessel 349 during liquid transfer of ammonia. In this way, a vapor pressure of the ammonia in final transfer vessel 345 will be significantly higher than a vapor pressure of the ammonia in receiving vessel 349 that forms as soon as liquid ammonia is present and, therefore, liquid transfer can continue by compression of the ammonia vapor in receiving vessel 349 rather than needing to allow escape of vapor from receiving vessel 349, for example, by bubbling.

Figure 7:
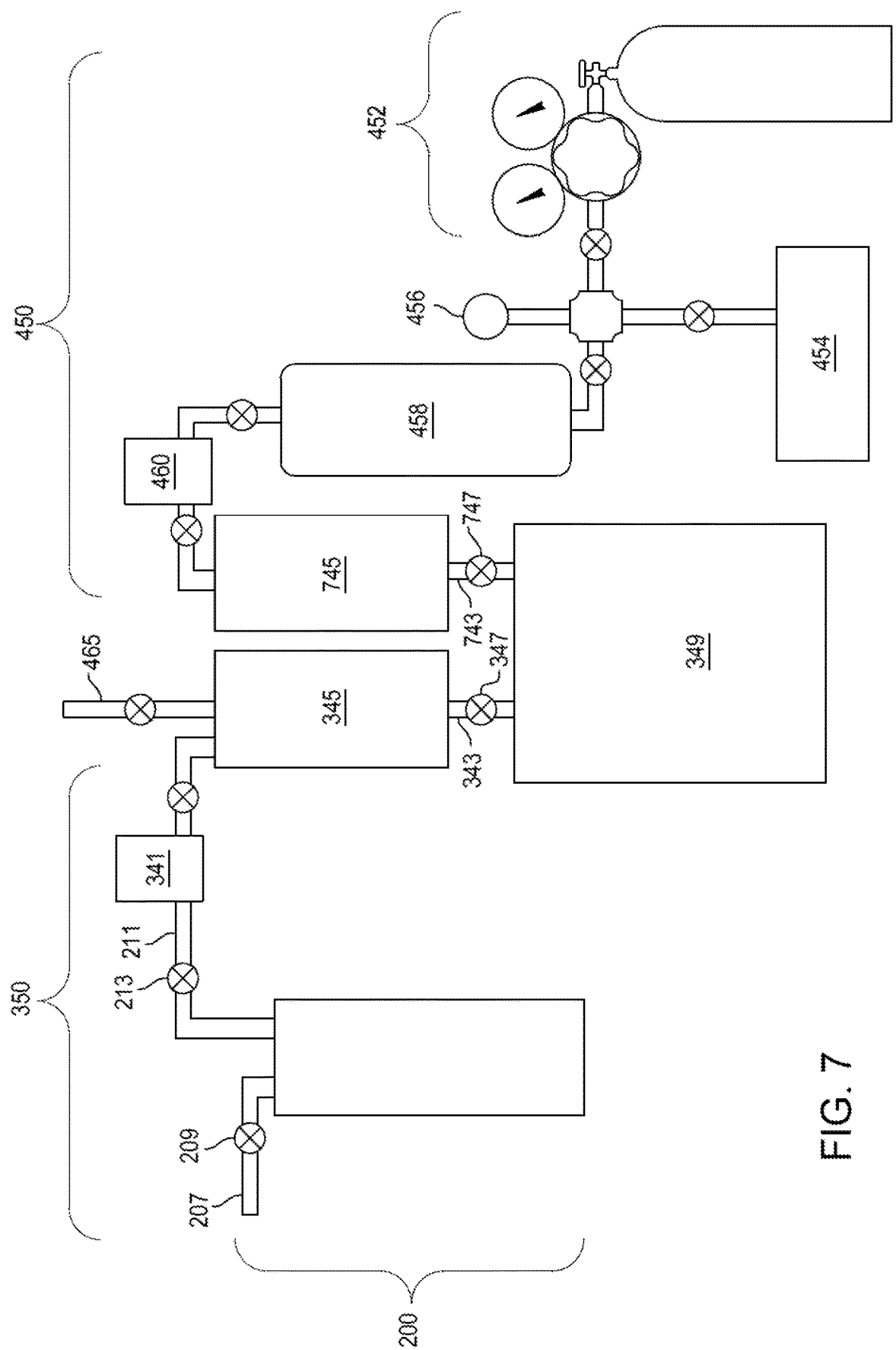
FIG. 7 is a schematic diagram of a fill system for a mineralizer composition and for ammonia according to an embodiment of the present disclosure.

In certain embodiments, a condensable mineralizer composition and ammonia are added to the receiving vessel using separate condensable mineralizer manifold 350 and ammonia manifold 450, as shown schematically in FIG. 7. Each manifold may have a separate connection to receiving vessel 349. In certain embodiments, mineralizer manifold 350 and ammonia manifold 450 are connected to the same inlet to receiving vessel 349, but sequentially, so that at most one manifold is connected to receiving vessel 349 at a given time, with repetitive pump-purge cycles performed before each disconnection and after each re-connection operation. In certain embodiments, ammonia manifold 450 is equipped with an ammonia transfer vessel 745, which is interfaced to receiving vessel 349 with an outlet 743 and valve 747. The use of separate manifolds reduces the risk of inadvertent $NH_4F$ formation within an integrated manifold. In certain embodiments, following transfer of a condensable mineralizer composition to receiving vessel 349, ammonia is transferred into the receiving vessel or capsule by a vapor-phase transfer process. Ammonia manifold 450, including ammonia transfer vessel 745, if present, may be purged and evacuated. Receiving vessel 349 may be chilled, for example, to approximately dry ice temperature, which will also reduce the vapor pressure of the condensable mineralizer already present in receiving vessel 349 to a very low level. One or more valves between ammonia source 452 and valve 747 may be opened, enabling ammonia to fill the ammonia manifold. Then valve 747 may be opened, enabling ammonia gas to flow through point-of-use purifier 458, being metered and controlled by mass flow controller 460, and condensing as a liquid in receiving vessel 349.

In certain alternative embodiments, ammonia is transferred into receiving vessel 349 by a liquid-phase transfer process. For example, referring again to FIG. 7, following transfer of the condensable mineralizer composition to receiving vessel 349, ammonia transfer vessel 745 may be evacuated. In certain embodiments, ammonia transfer vessel 745 is chilled, for example, to approximately dry ice temperature, and one or more valves between ammonia source 452 and ammonia transfer vessel 745 are opened. Ammonia gas flows through point-of-use purifier 458, is metered and controlled by mass flow controller 460, and condenses as a liquid in ammonia transfer vessel 745. In certain embodiments ammonia transfer vessel 745 is chilled to a higher temperature, for example, between about −20 degrees Celsius and about 15 degrees Celsius and the ammonia transfer and condensation process is performed at elevated pressure, as described above. After the desired amount of ammonia has been added to ammonia transfer vessel 745, for example, by integrating the output of mass flow controller 458, ammonia transfer vessel 745 may be warmed to about 25 degrees Celsius, about 30 degrees Celsius, or higher, if desired. If receiving vessel 349 is approximately at room temperature, it may contain HF vapor at a pressure near one atmosphere, as shown in FIG. 6. As a consequence, when valve 747 is opened to receiving vessel 349, as ammonia begins to flow from ammonia transfer vessel 745 to receiving vessel 349, solid $NH_4F$ will immediately begin to form and will continue to form until the HF vapor and liquid in receiving vessel 349 have been fully converted to $NH_4F$ (and/or $NH_5F_2$). Issues associated with clogging can be reduced or eliminating by using a large-throat-diameter valve, such as a ball valve, for valve 747 and by opening it suddenly and fully, and by using a fill tube with an inner diameter larger than 1 millimeter, larger than 2 millimeters, or larger than 3 millimeters. $NH_4F$ that is formed initially may be entrained by flowing, liquid ammonia, present at a pressure higher than 7 atmospheres, or higher than 10 atmospheres, depending on the temperature of the ammonia transfer vessel 745, and carried into receiving vessel 349. In certain embodiments, valve 747 and connection 743 are heated to a temperature between about 25 degrees Celsius and about 250 degrees Celsius, or between about 30 degrees Celsius and about 100 degrees Celsius, to inhibit formation of $NH_4F$ clogs in the line. Any residual $NH_4F$ in ammonia transfer vessel 745 or in the tubulation or valve between it and receiving vessel 349 may be transferred by heating to a temperature between about 100 degrees Celsius and about 250 degrees Celsius. In certain embodiments, an average temperature of ammonia transfer vessel 745 and final transfer vessel 345 are both maintained at a temperature that is higher, by between about 2 degrees Celsius and about 50 degrees Celsius, or by between about 5 degrees Celsius and about 25 degrees Celsius, than an average temperature of receiving vessel 349 during a liquid phase transfer from ammonia transfer vessel 745 to receiving vessel 349. A valve between receiving vessel 349 and final transfer vessel 345 may be open during a liquid phase ammonia operation so that vapor displaced from receiving vessel 349 by entering liquid may pass into final transfer vessel 345, thereby not impeding entry of more liquid ammonia into receiving vessel 349.

Following removal of the receiving vessel or capsule from the manifold, it may be warmed up to room temperature. In certain embodiments, a fill tube connecting the body of the receiving vessel or capsule to a valve is welded closed.

In certain embodiments, mineralizer formation processes may occur spontaneously or after additional processing. For example, formation of one or more of $NH_4F$ and $NH_5F_2$ may occur spontaneously upon addition of $NH_3$ to a receiving vessel containing HF, either directly at low temperature or after warming. $GaX_3$ (where X=F, Cl, Br, or I) may similarly form one or more complexes upon addition of $NH_3$. The rate of such formation reactions may be controlled by slow addition of gas-phase $NH_3$ to a receiving vessel containing HF, for example, at rates below about 12 standard liters per minute (SLM), below about 5 SLM, or below about 1 SLM until formation of the reaction product is complete. Appropriateness of the rate of slow addition of $NH_3$ may be verified by measuring the process pressure during $NH_3$ addition. Depending on the flow rate of ammonia, the temperature of the receiving vessel during $NH_3$ addition, and the conductance of the connection between the manifold and the interior of the receiving vessel, the pressure of the manifold during ammonia addition may be between about 0.1 Torr and about 15 atmospheres. In preferred embodiments, during a continuous slow-fill process, the pressure during ammonia addition is steady and does not show short-term fluctuations or spikes having a duration between about 1 millisecond and about 10 seconds. In certain embodiments, for example, when the temperature of the receiving vessel is above about −25 degrees Celsius and the pressure of ammonia during the fill operation is higher than about 1.5 atmosphere (for example, see FIG. 5), slow addition of $NH_3$ may be performed by short pulses of ammonia, for example, with a duration between about 0.01 second and about 30 seconds, or between about 0.1 second and about 10 seconds, separated by pauses between about 1 second and about 60 seconds, rather than as a continuous flow, so as to allow for gradual, controlled occurrence of mineralizer-formation reactions. Additional mineralizer formation reactions may occur at elevated temperatures, for example, formation of one or more of $GaF_3 \cdot 2\ NH_3$ and $(NH_4)_3GaF_6$ by reaction of $NH_4F$ and $NH_3$ with a group III metal nitride. To provide a range of ammonia filling rates before and after mineralizer reaction completion multiple mass flow controllers having the same or different mass flow ranges may be arranged in parallel, significantly reducing filling time while maintaining good accuracy, for example, as shown in FIG. 1. Subsequent to formation of a mineralizer reaction product, ammonia may be added to the receiving vessel at rates between about 1 SLM and about 1000 SLM, between about 5 SLM and about 500 SLM, or between about 10 SLM and about 250 SLM.

The control system for the manifold may include a controller, a processor in communication with the controller, and a wired or wireless communication system that allows the controller to communicate with sensors, valves, sources, monitoring and evaluating equipment, and the like. The controller includes a central processing unit (CPU), memory, and support circuits. The controller is used to control one or more of the process sequences disclosed herein. The CPU is a general-purpose computer processor configured for use in an industrial setting for controlling processing equipment and other devices related thereto. The memory described herein, which is generally non-volatile memory, may include random access memory, read only memory, floppy or hard disk drive, or other suitable forms of digital storage, local or remote. The support circuits are conventionally coupled to the CPU and comprise cache, clock circuits, input/output subsystems, power supplies, and the like, and combinations thereof. Software instructions (program) and data can be coded and stored within the memory for instructing a processor within the CPU. A software program (or computer instructions) readable by CPU in the controller determines which tasks are performable by the components in the overall system disclosed herein. Preferably, the program, which is readable by CPU in the controller, includes code, which when executed by the processor (CPU), perform tasks relating to the monitoring and execution of one or more of the methods or method steps described herein. The program will include instructions that are used to control the various hardware and electrical components within the system to perform the various process tasks and various process sequences used to implement the processing methods described herein.

The sensors of the support circuits, which are disposed within the manifold may sense conditions within the manifold and/or the transfer or receiving vessel, such as the temperature, pressure, and/or gas concentration and composition, and may signal information to the controller. Flow rate monitors may signal information about the flow rate through the corresponding inlet or outlet to the controller. The controller (via the processor) may respond to the information received, and may control devices in response to the information and pre-determined instruction parameters. For example, the controller may signal the energy source to provide thermal energy to the heating jacket for the manifold. The controller may signal one or more valves to open, close, or open to a determined flow level during the course of mineralizer synthesis. The controller may be programmed to implement a method of synthesizing purified mineralizer compositions according to embodiments of the disclosure.

The controller can be programmed to accept multiple parameters to realize the desired control of the pneumatic or solenoid valves during preprogrammed sequences to pump, purge, distill HF, transfer HF, dispose of HF bottoms, transfer ammonia, or disconnect the capsule, as well as several maintenance procedures. In addition to the preprogrammed sequence, a manual mode can be accessed troubleshooting and non-routine maintenance and testing. In some configurations mass flow controller (MFC) setpoints can be entered outside of the preprogrammed sequence in manual mode. Valve interlocks and alarms can be used to prevent opening certain valve combinations considered either dangerous or destructive to the equipment.

Through use of a preprogrammed sequence stored in memory, text prompts not related to valve sequences can be used to prompt an operator when to perform certain tasks, including heating and cooling a chiller, the manifold, and/or a capsule Dewar, opening and closing gas cylinders, opening and closing manual valves, and performing various leak checks before certain operations. In certain configurations, once the operator has performed the task, the operator can press "NEXT" to continue the preprogrammed sequence. Text prompts can also be used to notify the operator about the purpose of the current valve configuration and the condition needed for the process to move to the next step. For example, this could take the form of "purging line, waiting for process pressure" with a displayed timer. For one, several, or all pump-purge sequences preprogrammed parameters can include: number of pump-purge cycles in a given sequence, high pressure and purge time in a pump-purge cycle before moving to a pump or the next step in a sequence and, low pressure target and pump time before moving to a purge or the next step in a sequence. Conditions such as passing a pressure rise test can be used to check the system in a loop if additional pump purges are needed. Otherwise, the sequence may return to a pump step. In certain embodiments it is useful to combine pump-purge steps with transferring a condensable mineralizer and/or ammonia in these preprogrammed sequences for ease of operation and to ensure minimal contamination.

Warnings and alarms sent from the controller can be configured to notify the operator of process conditions that are out of specification or if a process needs attention. These can take the form of high and low temperature/pressure and flow alarms or preprogrammed steps going over a certain time. In addition, the warning and alarm system can track mineralizer and ammonia usage and provide notification for when maintenance is needed. Preprogrammed process set points can be prompted to change at the beginning of the sequence for set points that change run to run including mineralizer and ammonia amounts.

By performing the methods described herein, the ultrapure mineralizer will desirably have a total oxygen concentration, including adsorbed moisture, hydrates, and chemically-bonded oxides, less than about 100 parts per million by weight. In certain embodiments, the oxygen concentration within the purified mineralizer is less than about 10 parts per million, less than about 5 parts per million, less than about 2 parts per million, less than about 1 part per million, less than about 0.3 part per million, or less than about 0.1 part per million. The ultrapure mineralizer may also have a purity, on a trace metals basis, that is greater than greater than 99%, greater than 99.9%, greater than 99.99%, greater than 99.999%, or greater than 99.9999%. The ultrapure mineralizer may also have a total concentration of other light main group elements, such as boron, carbon, silicon, phosphorus, and sulfur, that is less than 10 parts per million, less than 1 part per million, or less than 0.1 part per million.

Figure 9:
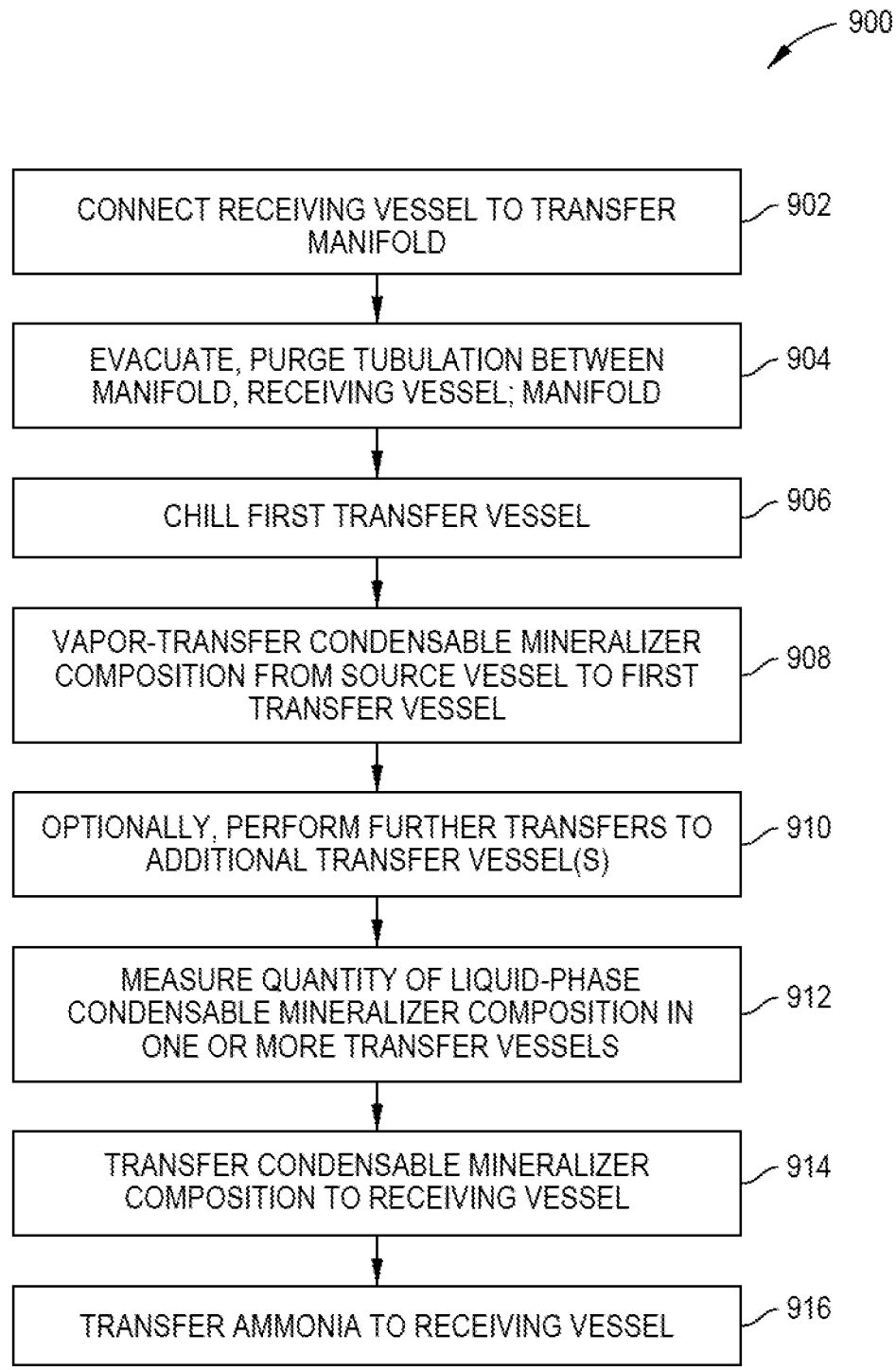
FIG. 9 is a flowchart summarizing synthesis of a composition according to an embodiment of the present disclosure.

A simplified flow diagram 900 for synthesis of an ultrapure mineralizer is shown in FIG. 9, which may be performed by use of one or more programs executed by the processor of the controller. This diagram is merely an example and thus is not intended to limit the scope of the disclosure provided herein. One skilled in the art would recognize other modifications, variations, and alternatives. In step 902, a receiving vessel is connected to the condensable mineralizer transfer manifold with a leak-tight seal. In step 904, the tubulation and/or space encompassed by the new connection is evacuated and purged, along with further evacuation and purging of additional portions of the manifold. In step 906, the first transfer vessel is chilled. In step 908, a quantity of condensable mineralizer composition is transferred in the vapor phase from the source vessel to the first transfer vessel. In step 910, optionally, at least a portion of the condensable mineralizer composition is transferred to one or more additional transfer vessels. In step 912, the quantity of condensable mineralizer composition in at least one transfer vessel is measured and, if necessary, adjusted to a predetermined level. In step 914, the condensable mineralizer composition from the final transfer vessel is transferred to the receiving vessel. In certain embodiments, the pressure within the manifold is maintained below a pressure of about one to about three atmospheres.

Surprisingly, the methods described herein provide reliable, accurate means for delivery of an ultrapure mineralizer to a receiving vessel for ammonothermal crystal growth. It is common practice within the semiconductor industry to utilize vacuum systems and gas manifolds of all-metal construction, such as all-stainless-steel and to control gas flows exclusively using mass flow controllers. For example, the mineralizer synthesis method described by Mikawa et al. generally follows these procedures. By contrast, the inventive method may utilize plastic as well as metal compositions and volumetric methods, which are commonly regarded as being insufficiently accurate for semiconductor-grade operations. For example, the use of both metal and plastic components in a vacuum system or gas manifold implies the need for metal-to-plastic seals, which are commonly regarded as unreliable and prone to leaks. Surprisingly, we find that the metal-to-plastic seals in the inventive manifold can be run reliably, albeit with regular preventive maintenance, that mineralizer volume to can be measured to better than 5%, better than 2%, or better than 1% accuracy, by means of simple volumetric methods. As noted previously, these volumetric methods avoid potential calibration issues with mass flow controllers. In addition, these methods avoid clogging issues that are common when working with condensable vapors, particularly with low-conductance components such as point-of-use purifiers.

In some embodiments, the mineralizer is used as a raw material for ammonothermal growth of at least one group III metal nitride single crystal. A capsule containing the ultrapure mineralizer and ammonia is placed within an autoclave or within an internally-heated high pressure apparatus, as described, for example, in U.S. Pat. No. 8,021,481 and in U.S. Application Publication No. 2010/0031875 and U.S. patent application Ser. No. 13/472,356. In the case of use in an autoclave, the space between the capsule and the inner diameter of the autoclave may be filled with ammonia to a similar volume percent as that within the capsule so as to generate a similar pressure on the exterior of the capsule as that within the interior of the autoclave upon heating, thereby minimizing deformation of the capsule (so-called pressure-balance method, as known in the art). After all the raw materials have been added to the autoclave or high pressure apparatus, the autoclave or high pressure apparatus is sealed.

The polycrystalline group III metal nitride is then processed in supercritical ammonia at a temperature greater than about 400 degrees Celsius and a pressure greater than about 50 megapascal (MPa), during which at least a portion of the polycrystalline group III metal nitride is etched away and recrystallized onto at least one group III metal nitride crystal having a wurtzite structure. In some embodiments, the polycrystalline group III metal nitride is processed in supercritical ammonia at a temperature greater than about 500 degrees Celsius, greater than about 550 degrees Celsius, greater than about 600 degrees Celsius, greater than about 650 degrees Celsius, greater than about 700 degrees Celsius, or greater than about 750 degrees Celsius. In some embodiments, the polycrystalline group III metal nitride is processed in supercritical ammonia at a pressure greater than about 100 MPa, greater than about 200 MPa, greater than about 300 MPa, greater than about 400 MPa, greater than about 500 MPa, or greater than about 600 MPa.

After performing crystal growth for a predetermined period of time, the autoclave or high-pressure apparatus is cooled. When the autoclave or capsule has cooled to below about 100 degrees Celsius, below about 75 degrees Celsius, below about 50 degrees Celsius, or below about 35 degrees Celsius, a valve to the autoclave is opened and/or the capsule is vented, and the ammonia is removed. In certain embodiments, gas-phase ammonia is allowed to exit the autoclave or capsule and is bubbled through an acidic aqueous solution in order to be chemically trapped. In certain embodiments, gas phase ammonia is passed through a flame so as to burn the ammonia, forming $H_2O$ and $N_2$. In certain embodiments, the ammonia is collected for purification and re-use.

After cooling, removal of the ammonia, and opening of the autoclave or internally-heated high-pressure apparatus and capsule, the grown crystals, or boules, are removed from the capsule or autoclave.

One or more wafers may be prepared from an as-grown boule using a single- or multi-wire saw, an inner-diameter saw, an outer-diameter saw, or the like. Prior to sawing, the boule may be precisely oriented using an x-ray goniometer, so as to prepare wafers with a pre-determined miscut angle. After slicing, the crystal wafers may be lapped, polished, and chemical-mechanically polished by methods that are known in the art. In some embodiments, the dislocation density at the large-area surfaces of the wafers is less than about 107 cm 2, less than about 106 cm 2, less than about 105 cm 2, less than about 104 cm-2, less than about 103 cm 2, or less than about 102 cm 2. In some embodiments, the full width at half maximum of the x-ray diffraction line corresponding to the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds.

Figure 10:
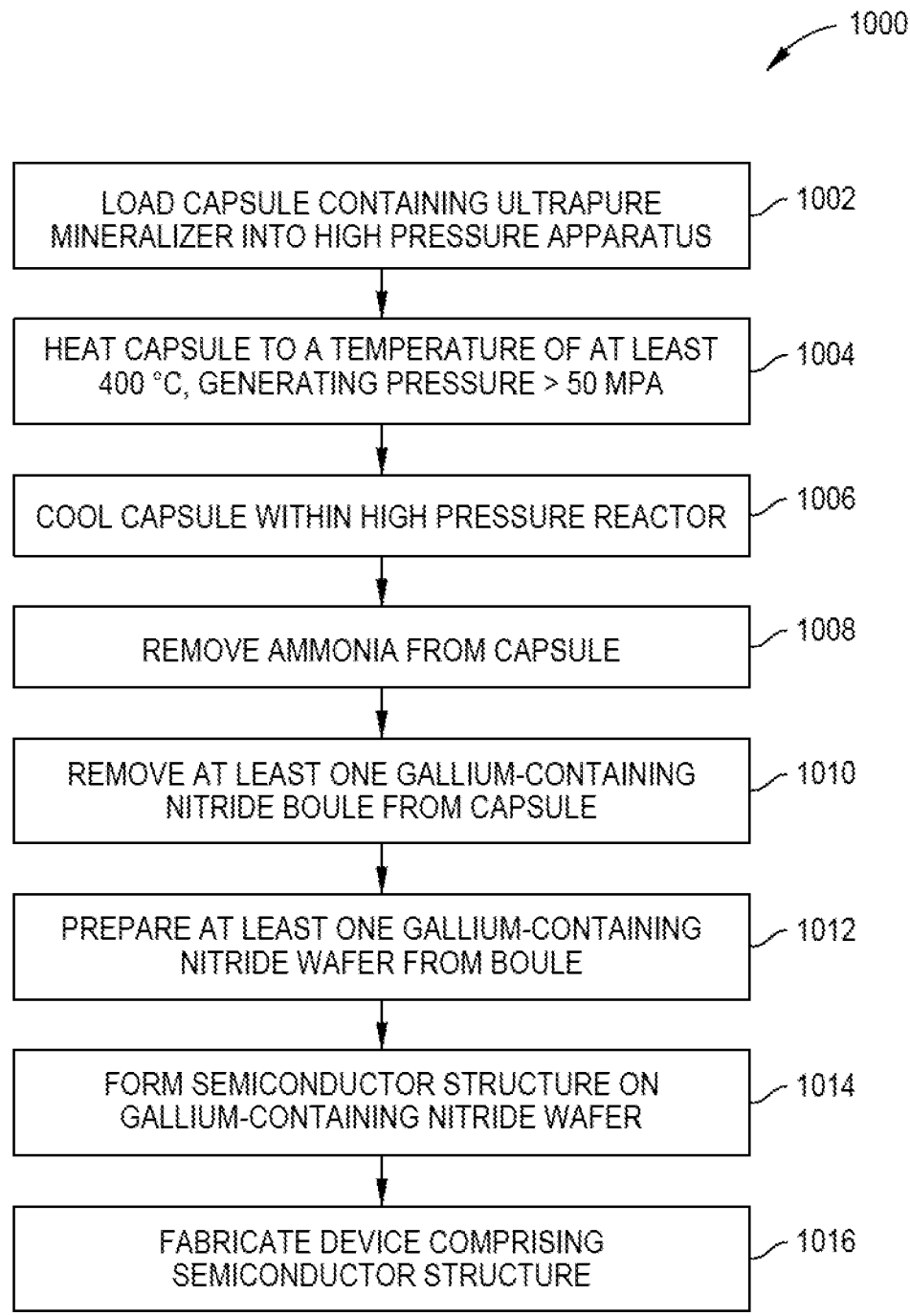
FIG. 10 is a flowchart summarizing utilization of a composition according to an embodiment of the present disclosure.

FIG. 10 depicts a block diagram of a system for growth of a group III metal nitride crystal using the ultrapure mineralizer disclosed herein.

As shown, the method of system 1000 commences at a step 1002 to load a capsule, filled with predetermined quantities of ultrapure mineralizer and ammonia, into a high pressure apparatus, such as an autoclave or an internally-heated high pressure reactor. In step 1004, the capsule is heated to temperature above about 400 Celsius, generating an internal pressure greater than about 50 MPa. In step 1006 the capsule within the high pressure reactor is cooled. In step 1008 the ammonia is removed from the capsule. In step 1010 at least one group III metal nitride boule is removed from the capsule. In step 1012, at least one group III metal nitride wafer is prepared from the at least one group III metal nitride boule. In step 1014, a semiconductor structure is formed on the group III metal nitride wafer, for example, comprising an $In_xAl_yGa_{1-x-y}N$ active layer, where $0 \leq x, y, x+y \leq 1$. In step 1016, a device comprising the semiconductor structure is fabricated, for example, at least one of a light-emitting diode, a laser diode, a diode, a photodiode, a sensor, or a transistor.

The group III metal nitride crystal wafers are useful as substrates for fabrication into semiconductor structures and, further, into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for a photoelectrochemical water splitting and hydrogen generation device.

While the above is a full description of the specific embodiments, various modifications, alternative constructions and equivalents may be used. Therefore, the above description and illustrations should not be taken as limiting the scope of the present disclosure, which is defined by the appended claims.

Still further embodiments support the method of making and method of use of the ultrapure mineralizer disclosed herein. Any of the embodiments below can be practiced in a variety of variations:

While the foregoing is directed to embodiments of the present disclosure, other and further embodiments of the disclosure may be devised without departing from the basic scope thereof, and the scope thereof is determined by the claims that follow.

What is claimed is:

1. A method for growth of group III metal nitride crystals, comprising:
providing a manifold comprising at least two transfer vessels, a first source vessel containing a condensable mineralizer composition comprising HF, a second source vessel containing ammonia, and a receiving vessel;
evacuating the receiving vessel;
transferring a first quantity of the condensable mineralizer composition to a first transfer vessel via a vapor phase and causing condensation of the condensable mineralizer composition within the first transfer vessel;
measuring the first quantity of the condensable mineralizer composition within the first transfer vessel;
transferring a second quantity of the measured first quantity of condensable mineralizer composition from the first transfer vessel to the receiving vessel;
transferring a first quantity of ammonia to a second transfer vessel;
transferring a second quantity of ammonia from the second transfer vessel to the receiving vessel via a liquid phase through a fill tube, wherein the fill tube has an inner diameter greater than 1 millimeter; and
forming at least a portion of a group III metal nitride boule by an ammonothermal crystal growth process that comprises:
exposing a seed crystal to a temperature of at least about 400 degrees Celsius, and
exposing the seed crystal to a mineralizer that is formed from the second quantity of condensable mineralizer composition and the second quantity of ammonia that were transferred to the receiving vessel,
wherein the first transfer vessel is heated to a temperature between 2 degrees Celsius and 50 degrees Celsius higher than a temperature of the receiving vessel during the transfer of the condensable mineralizer composition.

2. The method of claim 1, wherein the fill tube has an inner diameter greater than 2 millimeters.

3. The method of claim 1, wherein the first transfer vessel and the fill tube comprise at least one of silver, a silver alloy, Monel® 400, gold, platinum, palladium, rhodium, iridium, or ruthenium.

4. The method of claim 1, wherein the second quantity of the condensable mineralizer composition is in a liquid phase when transferred from the first transfer vessel to the receiving vessel.

5. The method of claim 1, wherein the second quantity of ammonia is transferred from the second transfer vessel to the receiving vessel in a liquid phase through a large-throat-diameter valve that comprises a ball valve.

6. The method of claim 1, wherein liquid ammonia has a pressure higher than 7 atmospheres during the transfer of the second quantity of ammonia from the second transfer vessel to the receiving vessel.

7. A method for growth of group III metal nitride crystals, comprising:
providing a manifold comprising at least two transfer vessels, a first source vessel containing a condensable mineralizer composition comprising HF, a second source vessel containing ammonia, and a receiving vessel;
evacuating the receiving vessel;
transferring a first quantity of the condensable mineralizer composition to a first transfer vessel via a vapor phase and causing condensation of the condensable mineralizer composition within the first transfer vessel;
measuring the first quantity of the condensable mineralizer composition within the first transfer vessel;
transferring a second quantity of the measured first quantity of condensable mineralizer composition from the first transfer vessel to the receiving vessel;
transferring a first quantity of ammonia to a second transfer vessel;
transferring a second quantity of ammonia from the second transfer vessel to the receiving vessel via a liquid phase through a fill tube, wherein the fill tube has an inner diameter greater than 1 millimeter; and
forming at least a portion of a group III metal nitride boule by an ammonothermal crystal growth process that comprises:
exposing a seed crystal to a temperature of at least about 400 degrees Celsius, and
exposing the seed crystal to a mineralizer that is formed from the second quantity of condensable mineralizer composition and the second quantity of ammonia that were transferred to the receiving vessel,
wherein a valve and a connection between the second transfer vessel and the receiving vessel are heated to a temperature between about 25 degrees Celsius and about 250 degrees Celsius during the transfer of the second quantity of ammonia from the second transfer vessel to the receiving vessel.

8. The method of claim 7, wherein the valve and the connection between the second transfer vessel and the receiving vessel are heated to a temperature between about 30 degrees Celsius and about 100 degrees Celsius during the transfer of the second quantity of ammonia from the second transfer vessel to the receiving vessel.

9. The method of claim 1, wherein condensation of the condensable mineralizer composition within the first transfer vessel is achieved by chilling a metallic member within the first transfer vessel, wherein the metallic member comprises at least one of silver, a silver alloy, Monel® 400, gold, platinum, palladium, rhodium, iridium, or ruthenium and has a metallic surface that is configured to condense and chill the condensable mineralizer composition in a liquid phase.

10. The method of claim 1, wherein a transferred quantity of the condensable mineralizer composition within the first transfer vessel is determined volumetrically, and further comprising measuring a temperature of the condensable mineralizer composition.

11. The method of claim 1, wherein a fluid height of the condensable mineralizer composition is measured by a fluid level sensor, wherein the fluid level sensor comprises at least one of an ultrasonic level transmitter, a laser level transmitter, a guide pulse sensor, or a sensing guide pulse transducer.

12. The method of claim 1, further comprising transferring a second mineralizer composition comprising at least one of chlorine, bromine, or iodine to the receiving vessel.

13. The method of claim 1, further comprising passing the condensable mineralizer composition through a fractionating column and performing a fractional distillation purification process on the condensable mineralizer composition.

14. The method of claim 9, wherein a purification of at least five theoretical plates is achieved, relative to a mineralizer composition received directly from the first source vessel.

15. The method of claim 1, wherein the second transfer vessel is heated to a temperature between temperature between 2 degrees Celsius and 50 degrees Celsius higher than a temperature of the receiving vessel during the liquid phase transfer of ammonia.

16. The method of claim 1, further comprising forming at least one group III metal nitride wafer from the group III metal nitride boule grown ammonothermally.

17. A method for growth of group III metal nitride crystals, comprising:
    providing a manifold comprising a first transfer vessel, a source vessel containing a condensable mineralizer composition comprising HF, and a receiving vessel;
    chilling a metallic member within the first transfer vessel, wherein the metallic member comprises at least one of silver, a silver alloy, Monel® 400, gold, platinum, palladium, rhodium, iridium, or ruthenium and has a metallic surface that is configured to condense and chill the condensable mineralizer composition in a liquid phase;
    transferring a quantity of the condensable mineralizer composition to the first transfer vessel via a vapor phase and causing condensation of the condensable mineralizer composition within the first transfer vessel;
    measuring the quantity of the condensable mineralizer composition within the first transfer vessel;
    transferring at least a portion of the condensable mineralizer composition from the first transfer vessel to the receiving vessel;
    transferring a measured quantity of ammonia to a second transfer vessel;
    transferring the measured quantity of ammonia from the second transfer vessel to the receiving vessel; and
    forming at least a portion of a group III metal nitride boule by an ammonothermal crystal growth process that comprises:
        exposing a seed crystal to a temperature of at least about 400 degrees Celsius, and
        exposing the seed crystal to a mineralizer that is formed from the condensable mineralizer composition transferred from the receiving vessel,
    wherein the first transfer vessel is heated to a temperature between 2 degrees Celsius and 50 degrees Celsius higher than a temperature of the receiving vessel during the transfer of the condensable mineralizer composition.

18. The method of claim 17, wherein at least a portion of the condensable mineralizer composition is transferred from the first transfer vessel to the receiving vessel in a liquid phase.

19. The method of claim 17, wherein the measured quantity of ammonia is transferred from the second transfer vessel to the receiving vessel in a liquid phase.

* * * * *